United States Patent
Naito

(10) Patent No.: US 9,899,275 B2
(45) Date of Patent: Feb. 20, 2018

(54) MANUFACTURING METHOD OF SEMICONDUCTOR DEVICE

(71) Applicant: Renesas Electronics Corporation, Koutou-ku, Tokyo (JP)

(72) Inventor: Kenzo Naito, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/378,427

(22) Filed: Dec. 14, 2016

(65) Prior Publication Data
US 2017/0256464 A1 Sep. 7, 2017

(30) Foreign Application Priority Data
Mar. 7, 2016 (JP) .................. 2016-043319

(51) Int. Cl.
| | |
|---|---|
| H01L 21/66 | (2006.01) |
| H01L 21/78 | (2006.01) |
| H01L 29/417 | (2006.01) |
| H01L 29/423 | (2006.01) |
| H01L 29/66 | (2006.01) |

(52) U.S. Cl.
CPC ............ H01L 22/12 (2013.01); H01L 21/78 (2013.01); H01L 29/41741 (2013.01); H01L 29/4236 (2013.01); H01L 29/66348 (2013.01); H01L 29/66734 (2013.01)

(58) Field of Classification Search
CPC ... H01L 22/12; H01L 21/78; H01L 29/41741; H01L 29/4236; H01L 29/66348; H01L 29/66734
See application file for complete search history.

(56) References Cited

U.S. PATENT DOCUMENTS

| | | | |
|---|---|---|---|
| 2003/0071994 A1* | 4/2003 | Borden | G01N 21/274 356/326 |
| 2003/0119281 A1* | 6/2003 | Suzuki | H01L 29/0657 438/460 |
| 2003/0216009 A1* | 11/2003 | Matsuura | H01L 23/544 438/460 |
| 2005/0035433 A1* | 2/2005 | Park | H01L 22/34 257/620 |

(Continued)

FOREIGN PATENT DOCUMENTS

JP 2009-050944 A 3/2009

*Primary Examiner* — Karen Kusumakar
(74) *Attorney, Agent, or Firm* — Shapiro, Gabor and Rosenberger, PLLC

(57) ABSTRACT

There is to provide a semiconductor device manufacturing method capable of improving reliability in a semiconductor device, including the following steps of: forming a semiconductor element on a semiconductor substrate, forming a wiring structure on the main surface of the semiconductor substrate, polishing the back surface of the semiconductor substrate, measuring the thickness of the semiconductor substrate, forming a back electrode on the back surface of the semiconductor substrate, and then cutting off the semiconductor substrate along the scribe region. In the step of measuring the thickness of the semiconductor substrate, it is measured in a portion where the main surface of the semiconductor substrate is bared without forming the insulating films included in the wiring structure.

17 Claims, 28 Drawing Sheets

(56) References Cited

U.S. PATENT DOCUMENTS

| | | | |
|---|---|---|---|
| 2009/0117710 A1* | 5/2009 | Kim | B28D 5/0011 438/462 |
| 2012/0094401 A1* | 4/2012 | Markwort | G01N 21/9501 438/8 |
| 2015/0266159 A1* | 9/2015 | Shiokawa | B24B 37/005 451/5 |

* cited by examiner

MANUFACTURING METHOD OF SEMICONDUCTOR DEVICE

CROSS-REFERENCE TO RELATED APPLICATIONS

The disclosure of Japanese Patent Application No. 2016-043319 filed on Mar. 7, 2016 including the specification, drawings and abstract is incorporated herein by reference in its entirety.

BACKGROUND

The invention relates to a method of manufacturing a semiconductor device and, for example, to a technique effectively applied to a manufacturing method of a semiconductor device having a back electrode.

A semiconductor device having a back electrode is manufactured in a way of forming a semiconductor element on a semiconductor substrate, forming a wiring structure on the semiconductor substrate, polishing the back surface of the semiconductor substrate to thin the semiconductor substrate, forming a back electrode on the back surface of the semiconductor substrate, and then, dicing the semiconductor substrate.

Japanese Unexamined Patent Application Publication No. 2009-50944 discloses a technique related to measuring the thickness of a substrate using the interference wave of a laser light.

SUMMARY

A semiconductor device having a back electrode also requires improvement in reliability.

Other problems and novel features will be apparent from the description of the specification and the attached drawings.

According to one embodiment, a method of manufacturing a semiconductor device includes the following steps of: forming a semiconductor element on a semiconductor substrate; forming a wiring structure on the main surface of the semiconductor substrate; polishing the back surface of the semiconductor substrate; measuring the thickness of the semiconductor substrate; forming a back electrode on the back surface of the semiconductor substrate; and then cutting the semiconductor substrate along the scribe region. In the step of measuring the thickness of the semiconductor substrate, it is measured in a first region where the main surface of the semiconductor substrate is bared without forming the insulating films included in the wiring structure.

Further, according to one embodiment, a method of manufacturing a semiconductor device includes the following steps of: forming a semiconductor element on a semiconductor substrate; forming a wiring structure on the main surface of the semiconductor substrate; polishing the back surface of the semiconductor substrate; measuring the thickness of the semiconductor substrate; forming a back electrode on the back surface of the semiconductor substrate; and then cutting off the semiconductor substrate along the scribe region. After finishing the step of forming the wiring structure, the insulating films included in the wiring structure are not formed on the main surface of the semiconductor substrate in the scribe region; and in the step of measuring the thickness of the semiconductor substrate, it is measured in the scribe region according to a laser interferometry.

According to one embodiment, the reliability of a semiconductor device can be improved.

DETAILED DESCRIPTION

Figure 1:
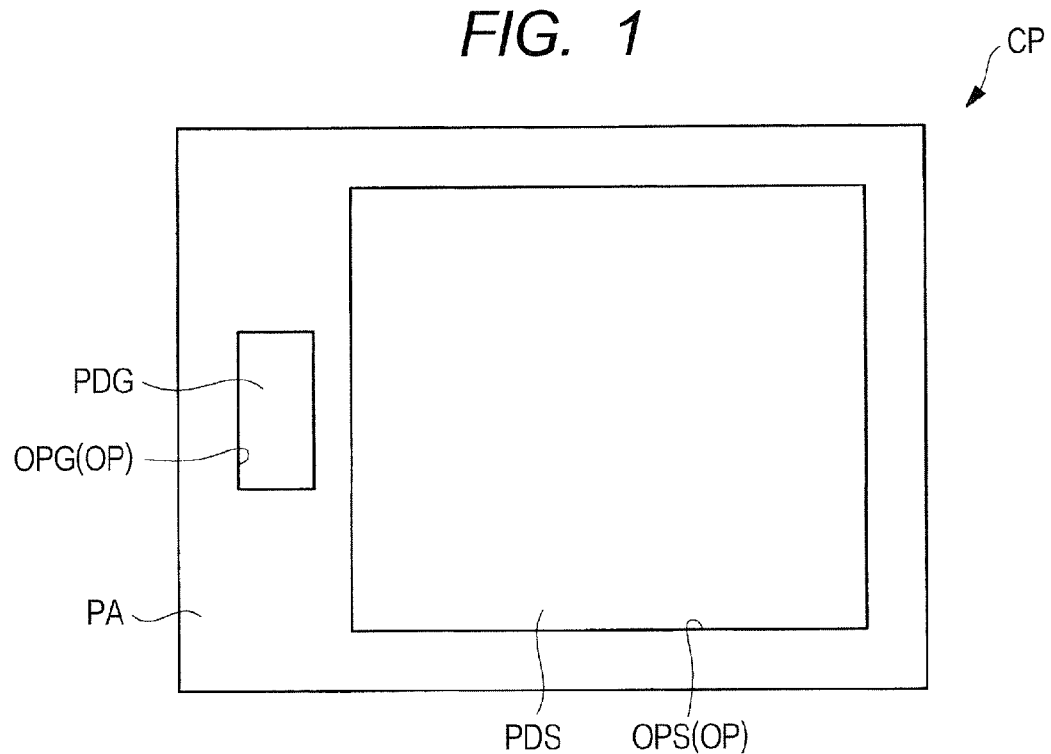
FIG. 1 is a whole top plan view of a semiconductor device according to one embodiment.

The following embodiments, if the necessity arises for the sake of convenience, will be described divided into a plurality of sections or forms; unless otherwise specified, they are mutually related to each other and one is related to the other in a part or in the whole of the modified examples as the detailed and supplementary description. Further, in case of referring to the number of the elements (including piece, numeric value, amount, and range), in the following embodiments, the number is not restricted to the specified number but may be more or less than the specified number, unless particularly specified and unless restricted to the specified number apparently on the principle. Further, in the following embodiments, it is needless to say that the component elements (including operation step) are not always essential unless particularly specified and unless apparently considered compulsory on the principle. Similarly, in the following embodiments, when referring to the shape and the positional relation of the component elements, they are to include their similarity or approximation unless particularly specified and unless they have apparently different shape and positional relation on the principle. This is true to the above numeric value and range.

Hereinafter, embodiments will be described in details based on the drawings. In the whole drawings for use in describing the embodiments, the same reference codes are attached to the materials having the same functions and the repeated description is saved. Further, in the following embodiments, a description of the identical or the similar portion is not repeated in principle unless it is required.

Further, in the drawings used in the embodiments, hatching may be sometimes omitted even in a cross-sectional view in order to make the drawings easy to view. Further, even in a top plan view, hatching may be given in order to make the drawings easy to view.

Embodiment

<Whole Structure of Semiconductor Device>

A semiconductor device according to one embodiment will be described referring to the drawings.

Figure 2:
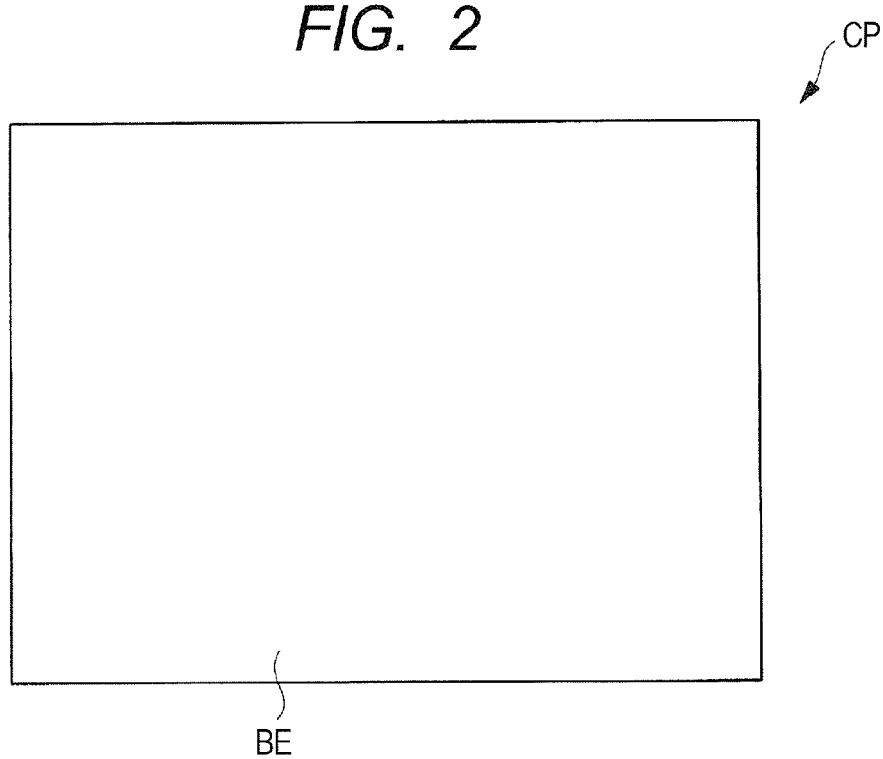
FIG. 2 is a whole top plan view of a semiconductor device according to one embodiment.

FIGS. 1 and 2 are whole top plan views of a semiconductor device (semiconductor chip) CP according to the embodiment; FIG. 1 shows the whole top plan view on the top side of the semiconductor device CP, and FIG. 2 shows the whole top plan view on the back surface (bottom surface) of the semiconductor device CP.

As shown in FIGS. 1 and 2, the semiconductor device (semiconductor chip) CP according to the embodiment has a top surface as a main surface and a back surface (bottom surface) as an opposite surface to the top surface; FIG. 1 shows the top surface of the semiconductor device CP and FIG. 2 shows the back surface of the semiconductor device CP.

The semiconductor device CP includes a pad for source (bonding pad for source) PDS as a first terminal and a pad for gate (bonding pad for gate) PDG as a control terminal on the top surface, as shown in FIG. 1, and includes a back electrode BE as a second terminal on the back surface, as shown in FIG. 2. The pad for source PDS, the pad for gate PDG, and the back electrode BE can work as terminals for external connection of the semiconductor device CP.

Specifically, an insulating film PA as a surface protective film is formed in the upmost layer on the top surface of the semiconductor device CP, the pad for source PDS is bared from an opening portion for source OPS provided in the insulating film PA, and the pad for gate PDG is bared from an opening portion for gate OPG provided in the insulating film PA. The upmost layer on the back surface (bottom surface) of the semiconductor device CP is the back electrode BE and the back electrode BE is formed on the whole back surface of the semiconductor device CP.

In a semiconductor substrate SB forming the semiconductor device CP, a semiconductor element is formed for controlling the conductivity between a first terminal (here, the pad for source PDS) formed on the top surface of the semiconductor device CP and a second terminal (here, the back electrode BE) formed on the back surface thereof. The semiconductor substrate SB forming the semiconductor device CP is not illustrated in FIGS. 1 and 2, but illustrated in FIGS. 4 to 20 described later. In the semiconductor device CP, by controlling the semiconductor element formed on the semiconductor substrate SB, the conductivity between the first terminal (here, the pad for source PDS) on the top surface and the second terminal (the back electrode BE) on the back surface is controlled, to run a current between the first terminal (here, the pad for source PDS) and the second terminal (the back electrode BE). As the result, the semiconductor device CP can be used as a switching element where a large current flows. The pad for gate PDG works as a control terminal for controlling the conductivity between the first terminal and the second terminal.

A power transistor can be used as the semiconductor element which is formed on the semiconductor substrate SB for controlling the conductivity between the first terminal on the top surface of the semiconductor device CP and the second terminal on the back surface thereof. As the power transistor, for example, a trench gate typed Metal Insulator Semiconductor Field Effect Transistor (MISFET) or a trench gate typed Insulated Gate Bipolar Transistor (IGBT) can be used. When using the MISFET as the semiconductor element, the first terminal on the top surface of the semiconductor device CP is a source terminal, the second terminal on the back surface thereof is a drain terminal, and the control terminal on the top surface thereof is a gate terminal. When using the IGBT as the semiconductor element, the first terminal on the top surface of the semiconductor device CP is an emitter terminal, the second terminal on the back surface thereof is a collector terminal, and the control terminal on the top surface thereof is a gate terminal. Therefore, when using the IGBT, the pad for source PDS becomes a pad for emitter.

<Manufacturing Process of Semiconductor Device>

The manufacturing process of a semiconductor device according to one embodiment of the invention will be described with reference to FIGS. 3 to 20.

Figure 3:
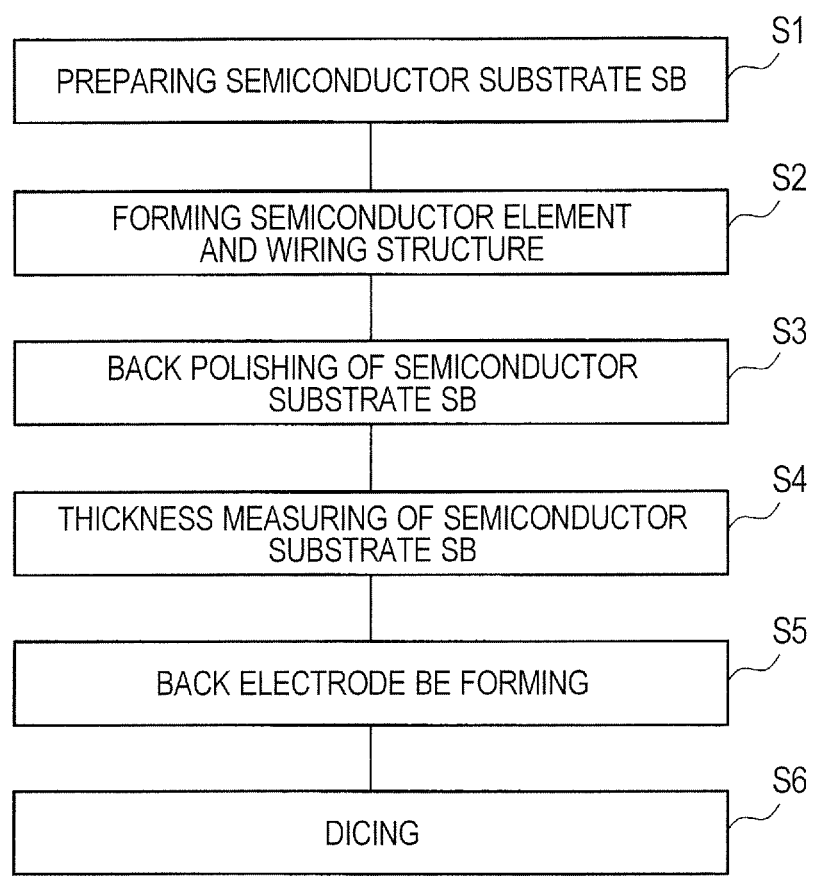
FIG. 3 is a process flow chart showing a manufacturing process of the semiconductor device according to one embodiment.

FIG. 3 is a process flow chart showing the manufacturing process of the semiconductor device according to the embodiment. FIGS. 4 to 20 are important portion cross-sectional views in the manufacturing process of the semiconductor device according to the embodiment. Each of FIGS. 4 to 20 shows a part of two adjacent semiconductor device regions (semiconductor element forming region, chip region) 1A and a scribe region (cut-off region) 1B between the semiconductor device regions 1A. As described later, the respective semiconductor device regions 1A are to be the individual semiconductor chips (semiconductor devices CP) later. As apparent from FIGS. 21 and 22 described later, each semiconductor device region 1A is surrounded by the scribe region 1B in plan view.

Figure 4:
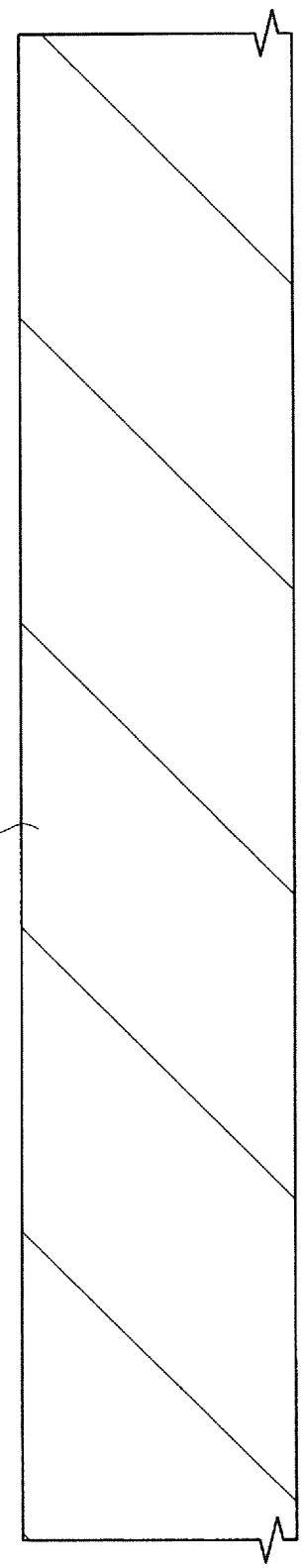
FIG. 4 is an important portion cross-sectional view in the manufacturing process of the semiconductor device according to one embodiment.

In manufacturing a semiconductor device, at first, as shown in FIG. 4, a semiconductor substrate SB (semiconductor wafer), for example, made of n type single crystal silicon is prepared (Step S1 in FIG. 3). Alternatively, as the semiconductor substrate SB, there can be used a semiconductor substrate with an epitaxial layer (semiconductor layer) made of n− type single crystal silicon having the lower concentration than that of the substrate main body made of n type single crystal silicon (what is called, an epitaxial wafer).

Figure 5:
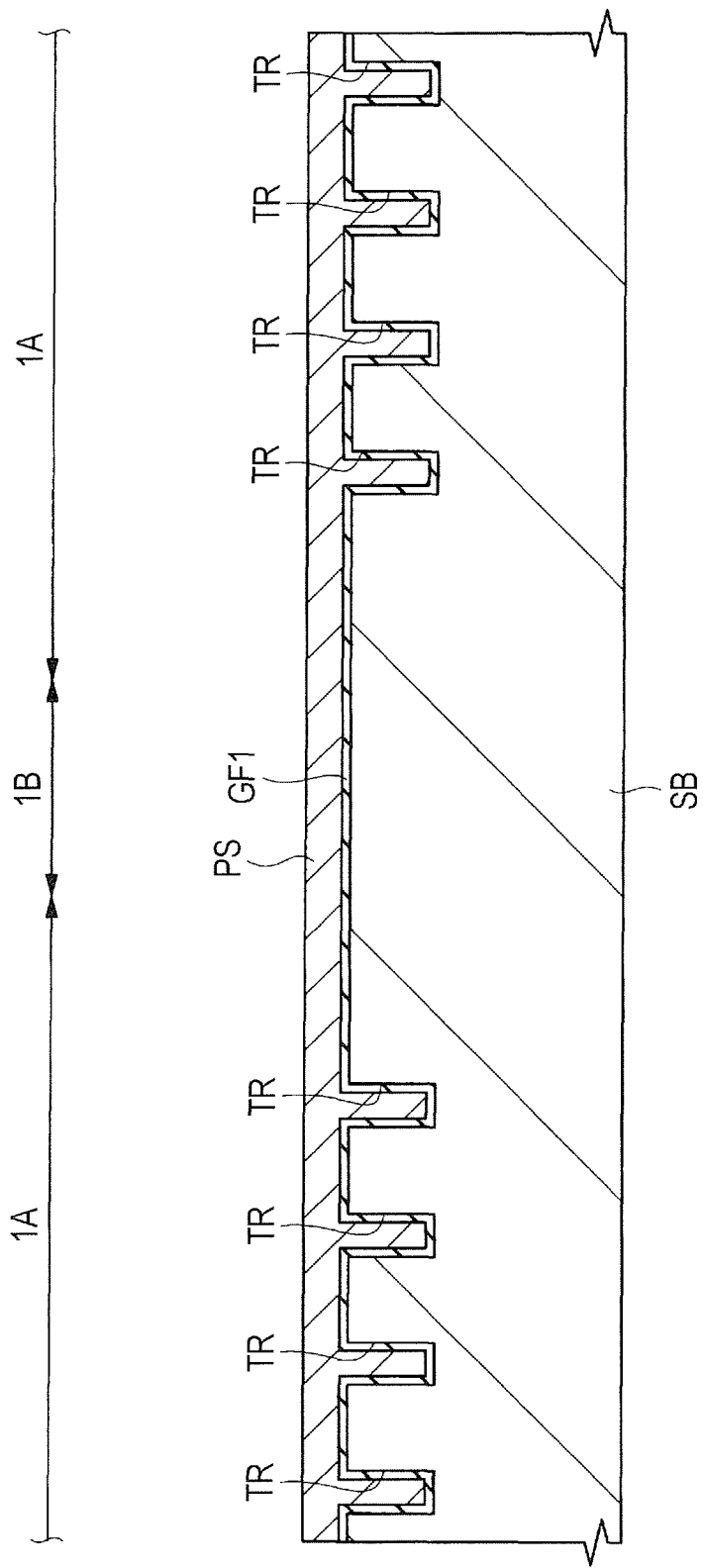
FIG. 5 is an important portion cross-sectional view in the manufacturing process of the semiconductor device, following FIG. 4.

Next, as shown in FIG. 5, trenches TR are formed on the main surface of the semiconductor substrate SB. The trench TR can be formed according to the photolithography and etching.

By using, for example, the thermal oxidation method, an insulating film GF1 made of a comparatively thinner silicon oxide film is formed on the inner wall (lateral and bottom surfaces) of the trench TR. This insulating film GF1 is to be a gate insulating film GF later and formed on the inner wall (lateral and bottom surfaces) of the trench TR and on the top surface where to bare the semiconductor substrate SB.

Then, a conductive film (conductor film) PS such as a polycrystalline silicon film (doped polysilicon film) regarded as having the lower resistivity as the result of introducing the dopants (for example, n type dopants) is formed on the whole main surface of the semiconductor substrate SB to fill the trenches TR, according to the CVD method.

A photoresist pattern (not illustrated) which covers a region where to form the gate wiring and uncovers the other region is formed on the conductive film PS, and this photoresist pattern is used as the etching mask, to etch the conductive film PS (etching, anisotropy etching). Through the etchback, the conductive film PS is left within the trench TR and under the photoresist pattern and the other conductive film PS is eliminated. Then, the photoresist pattern is eliminated. The insulating film GF1 remaining within the trench TR becomes a gate insulating film GF and the conductive film PS remaining within the trench TR becomes a gate electrode GE. Further, the conductive film PS remaining under the photoresist pattern becomes a gate drawing wiring (not illustrated), and the gate drawing wiring is formed integrally with the gate electrode GE. In the etchback process of the conductive film PS, the insulating film GF1 on the top surface of the semiconductor substrate SB (the other insulating film GF1 than on the inner wall of the trench TR) is sometimes eliminated.

Figure 6:
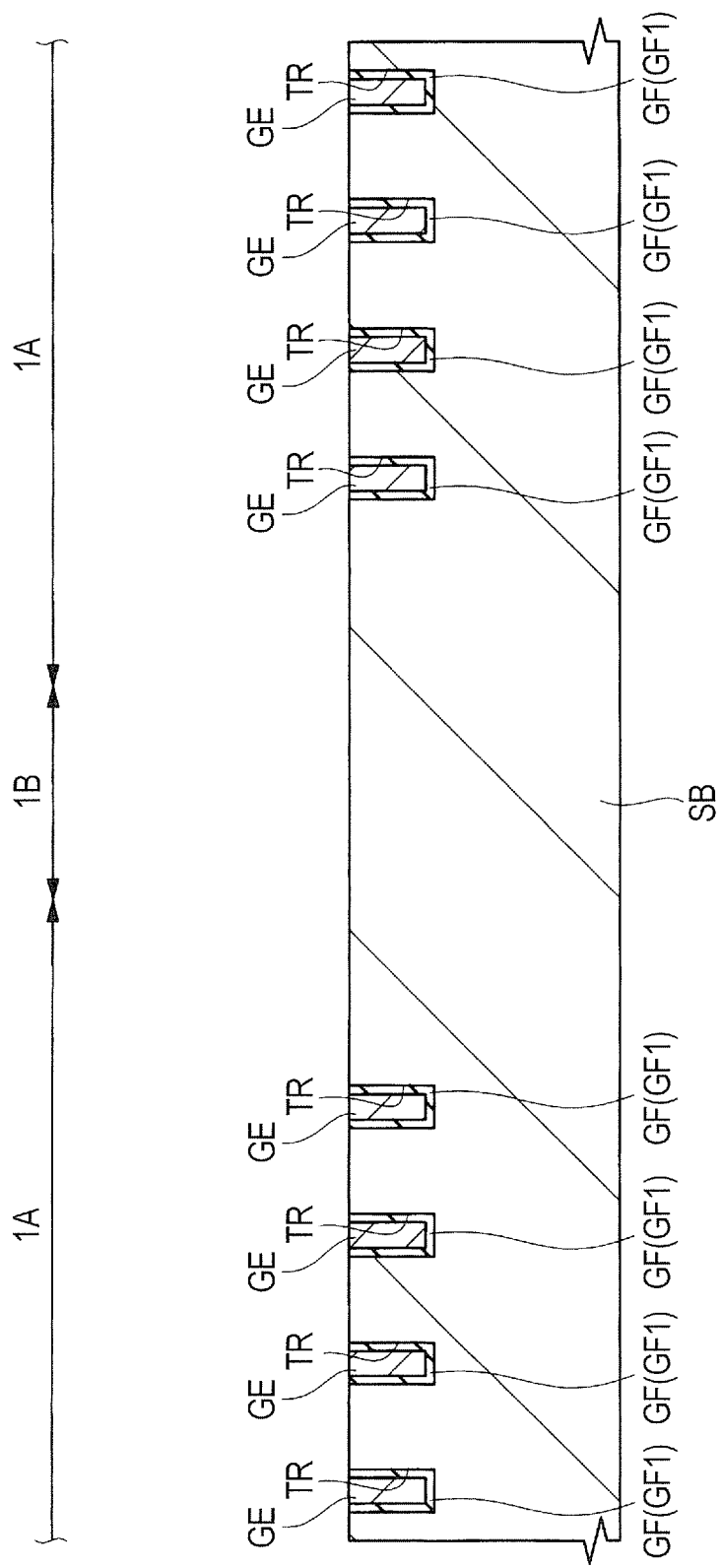
FIG. 6 is an important portion cross-sectional view in the manufacturing process of the semiconductor device, following FIG. 5.

According to this, as shown in FIG. 6, the gate electrode GE made of the conductive film PS embedded in the trench TR is formed. The gate electrode GE is embedded within the trench TR through the insulating film GF1 (that is, the gate insulating film GF). The trench TR and the gate electrode GE are formed in the semiconductor device region 1A but not in the scribe region 1B.

Figure 7:
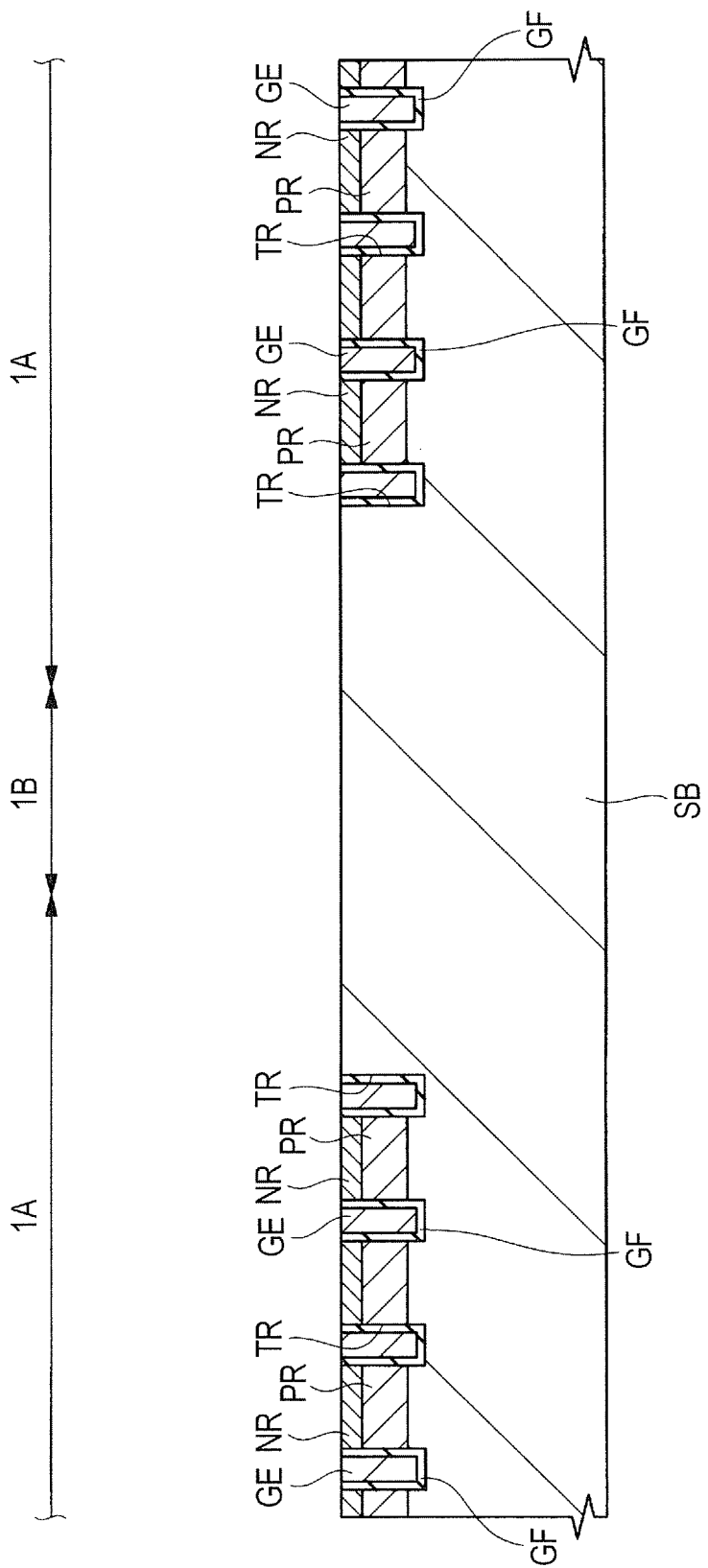
FIG. 7 is an important portion cross-sectional view in the manufacturing process of the semiconductor device, following FIG. 6.

Then, as shown in FIG. 7, a p type semiconductor region PR is formed by ion-implanting p type dopant (for example, boron (B)) to the main surface of the semiconductor substrate SB. The p type semiconductor region PR is formed in the upper portion of the semiconductor substrate SB in the semiconductor device region 1A.

An n+ type semiconductor region NR is formed by ion-implanting n type dopant (for example, arsenic (As)) to the main surface of the semiconductor substrate SB. The depth of the n+ type semiconductor region NR (to the bottom thereof) is smaller than the depth of the p type semiconductor region PR (to the bottom thereof). The p type semiconductor region PR and the n+ type semiconductor region NR are formed in the upper portion (surface portion) of the semiconductor substrate SB in the semiconductor device region 1A; the n+ type semiconductor region NR is formed on the p type semiconductor region PR or the p type semiconductor region PR is under the n+ type semiconductor region NR. The n+ type semiconductor region NR and the p type semiconductor region PR are formed shallower than the trench TR, and the trench TR penetrates the n+ type semiconductor region NR and the p type semiconductor region PR into the semiconductor substrate SB thereunder at its bottom end. Any of the p type semiconductor region PR and the n+ type semiconductor region NR may be formed earlier. The n+ type semiconductor region NR is a semiconductor region for source and the p type semiconductor region PR is a semiconductor region for channel. The n type substrate region under the p type semiconductor region PR (n type semiconductor substrate SB positioned under the p type semiconductor region PR) can work as a semiconductor region for drain.

Next, the activation annealing is performed as the thermal treatment for activating the dopants introduced so far.

Figure 8:
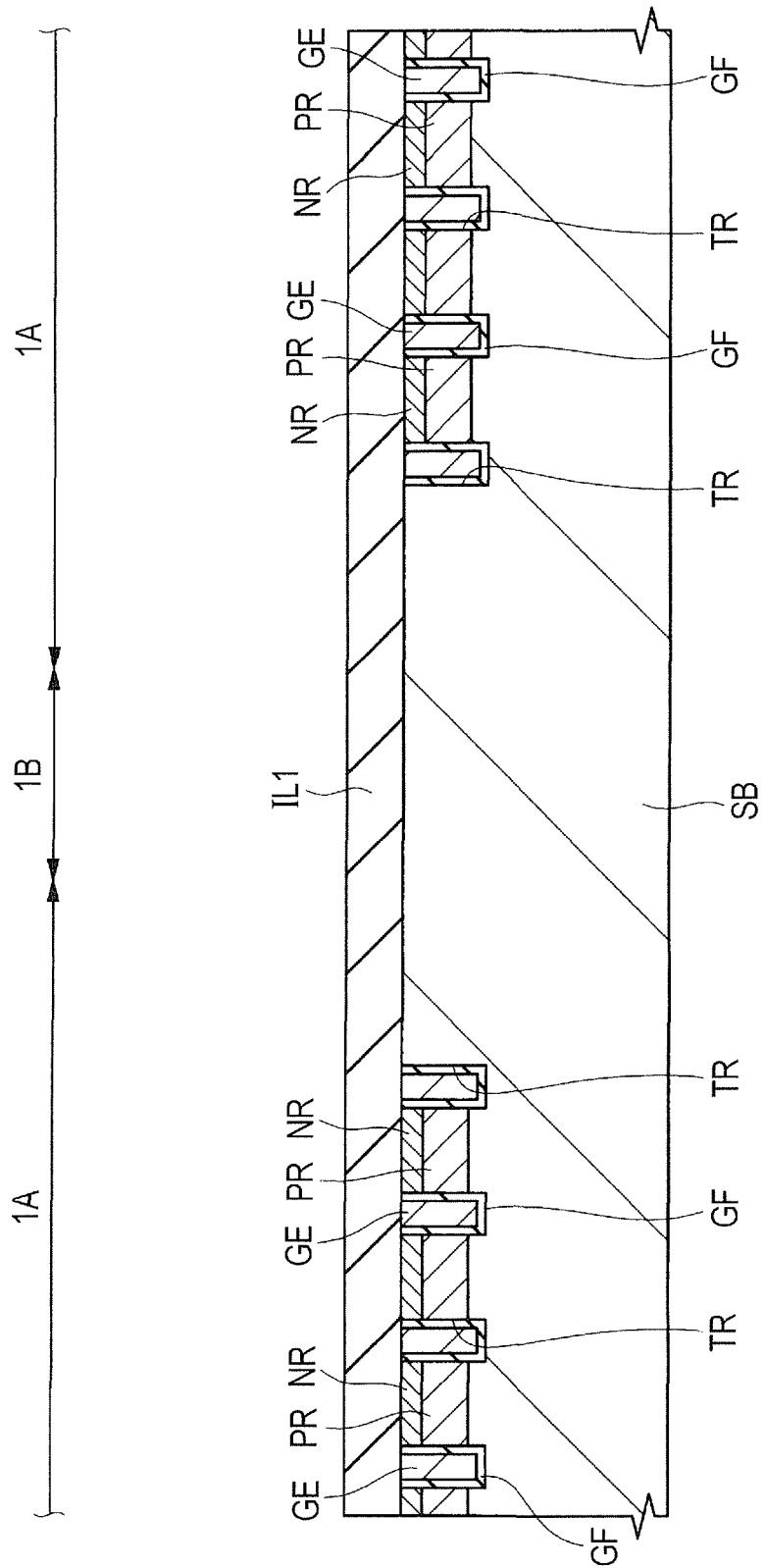
FIG. 8 is an important portion cross-sectional view in the manufacturing process of the semiconductor device, following FIG. 7.

As shown in FIG. 8, an insulating film IL1 as an interlayer insulating film is formed on the main surface (the whole main surface) of the semiconductor substrate SB, to cover the gate electrode GE and the gate drawing wiring (not illustrated). The insulating film IL1 is made of, for example, silicon oxide film.

Figure 9:
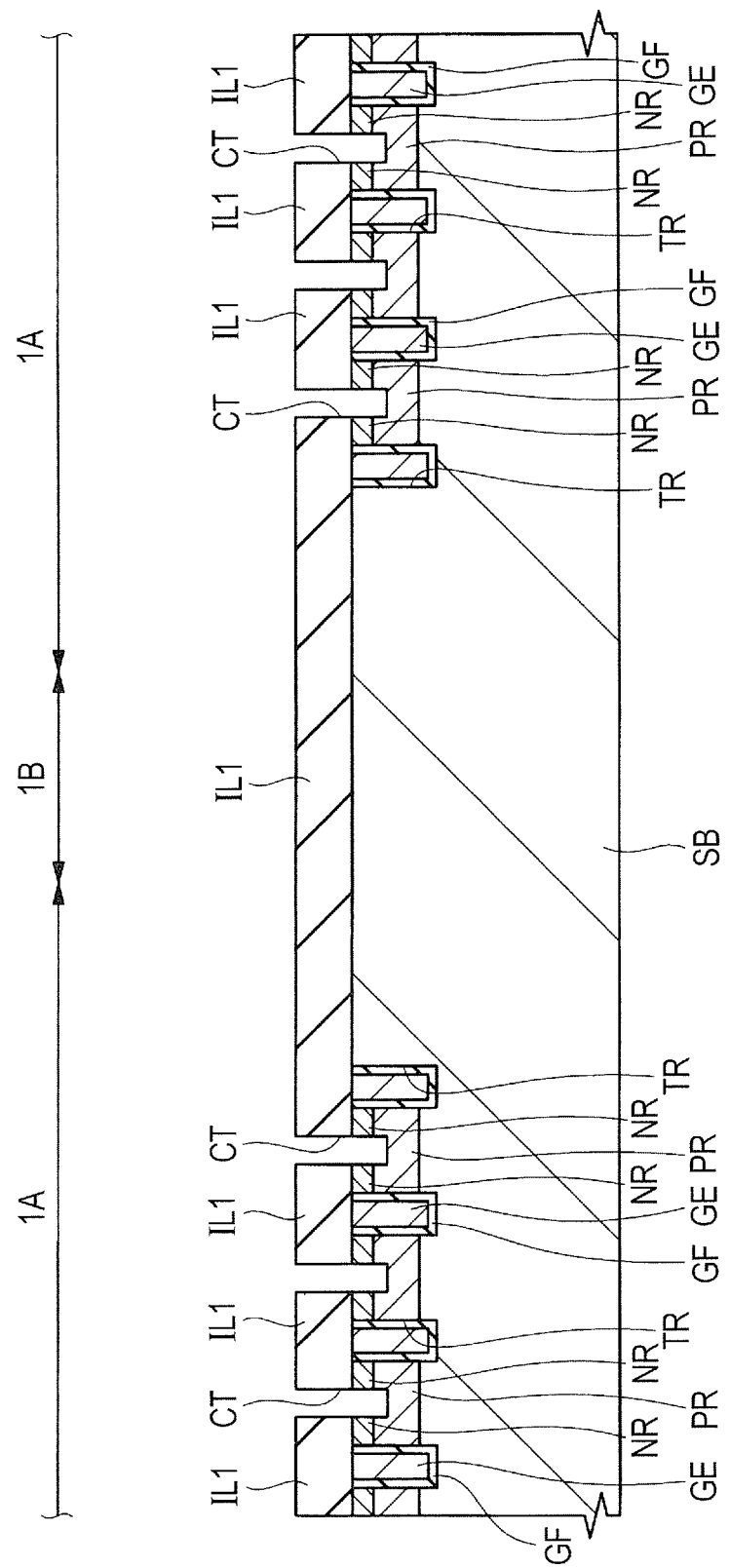
FIG. 9 is an important portion cross-sectional view in the manufacturing process of the semiconductor device, following FIG. 8.

As shown in FIG. 9, by using the photoresist pattern (not illustrated) formed on the insulating film IL1 according to the photolithography as the etching mask, the insulating film IL1 is etched (for example, dry etched) and further, the semiconductor substrate SB is etched (for example, dry etched), hence to form a contact hole source CT. The contact hole for source CT is arranged between the adjacent trenches TR in plan view, in a way of penetrating the insulating film IL1 and the n+ type semiconductor region NR arriving at the p type semiconductor region PR at its bottom end. Therefore, the p type semiconductor region PR is bared in the bottom of the contact hole for source CT and the n+ type semiconductor region NR is bared in the lower lateral portion of the contact hole for source CT.

Here, after forming the contact hole for source CT, by ion-implanting the p type dopant to the p type semiconductor region PR bared from the bottom of the contact hole for source CT, the p+ type semiconductor region of higher dopant concentration than that of the p type semiconductor region PR also can be formed at the position in contact with the bottom surface of the contact hole for source CT.

Although it is not illustrated in FIG. 9, by using the other photoresist pattern (not illustrated) formed on the insulating film IL1 according to the photolithography as the etching mask, the insulating film IL1 is etched (for example, dry etched), to form a contact hole for gate (not illustrated) on the gate drawing wiring (not illustrated).

Figure 10:
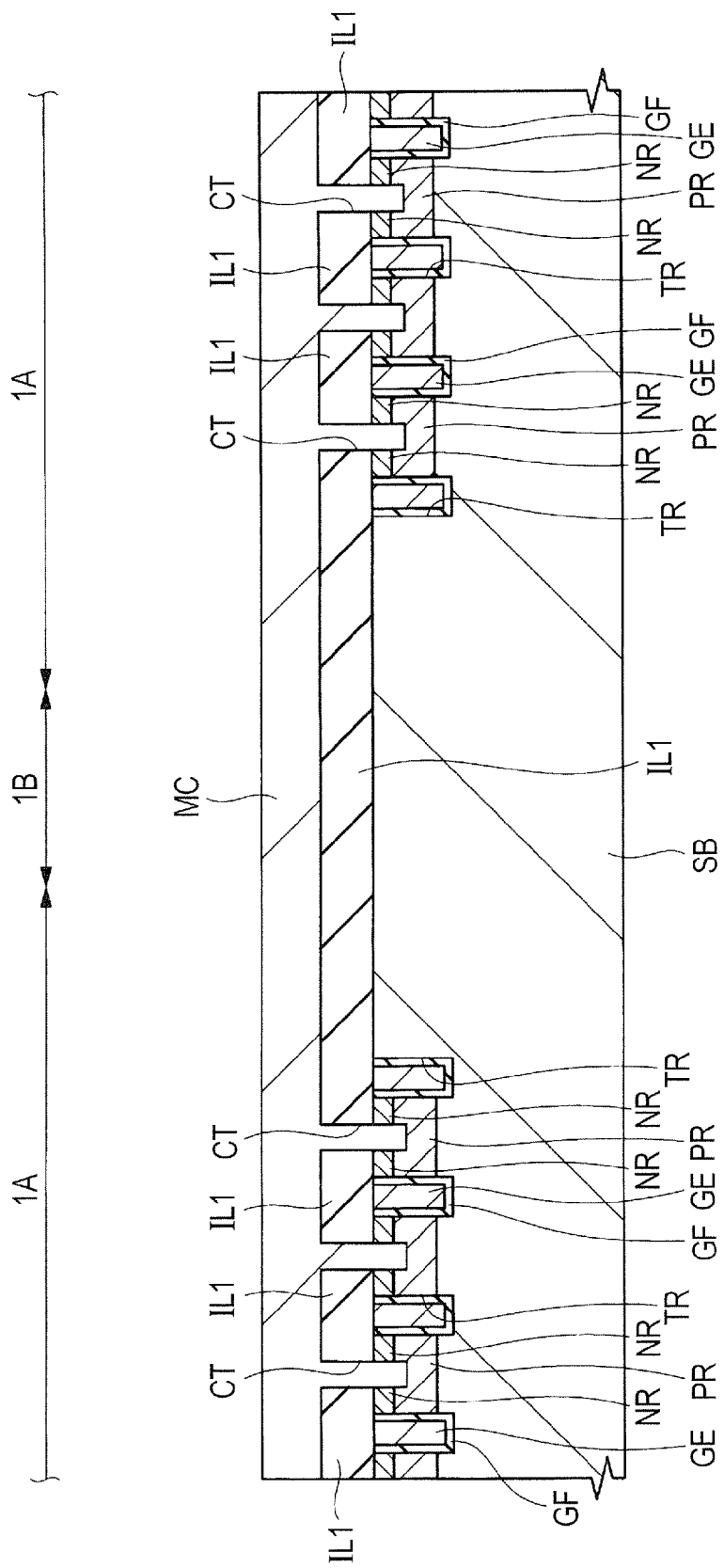
FIG. 10 is an important portion cross-sectional view in the manufacturing process of the semiconductor device, following FIG. 9.

As shown in FIG. 10, a conductor film (metal film) MC mainly made of aluminum (Al) is formed on the whole main surface of the semiconductor substrate SB or on the insulating film IL1 within the contact hole for gate and the contact hole for source CT, according to the sputtering.

Figure 11:
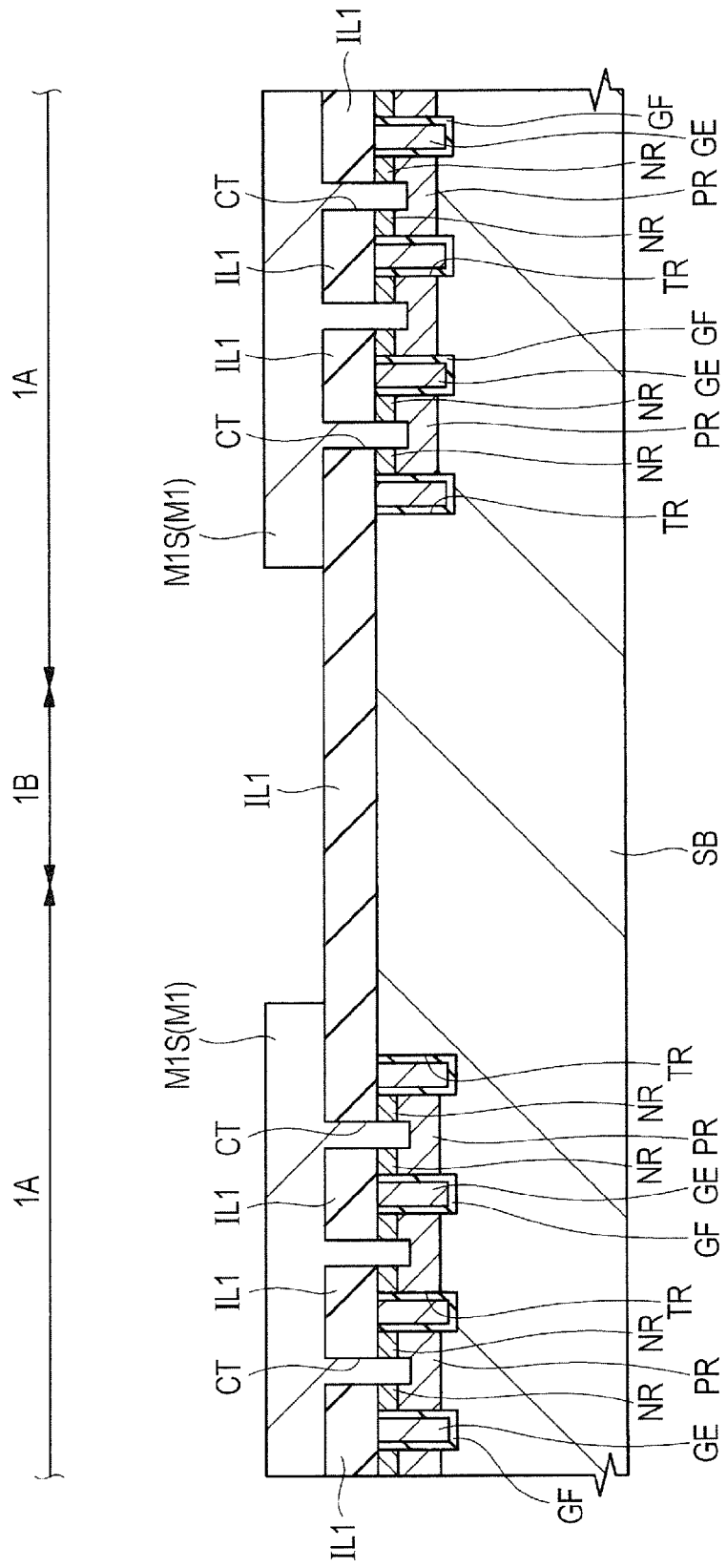
FIG. 11 is an important portion cross-sectional view in the manufacturing process of the semiconductor device, following FIG. 10.

As shown in FIG. 11, the conductor film MC is patterned according to the photolithography and the etching, hence to form wiring M1. The wiring M1 is formed by the patterned conductor film MC. The wiring M1 includes wiring for source M1S and wiring for gate. The wiring M1 (source wiring M1S and gate wiring) is formed in the semiconductor device region 1A but not in the scribe region 1B. Although the gate wiring is not shown in FIG. 11, the pad for gate PDG shown in FIG. 1 as mentioned above is made by the gate wiring bared from the opening portion for gate OPG.

The source wiring M1S is formed on the insulating film IL1 and a part of the source wiring M1S is embedded inside the contact hole for source CT. Of the source wiring M1S, a part embedded in the contact hole for source is to be referred to as "via portion of source wiring M1S". The via portion of the source wiring M1S is in contact with the n+ type semiconductor region NR and the p type semiconductor region PR in the vicinity of the bottom of the contact hole for source CT, to be electrically coupled to these. The via portion of the gate wiring (embedded portion in the contact hole for gate) is electrically coupled to the gate drawing wiring and through the gate drawing wiring, it is electrically coupled to the gate electrode GE.

Figure 12:
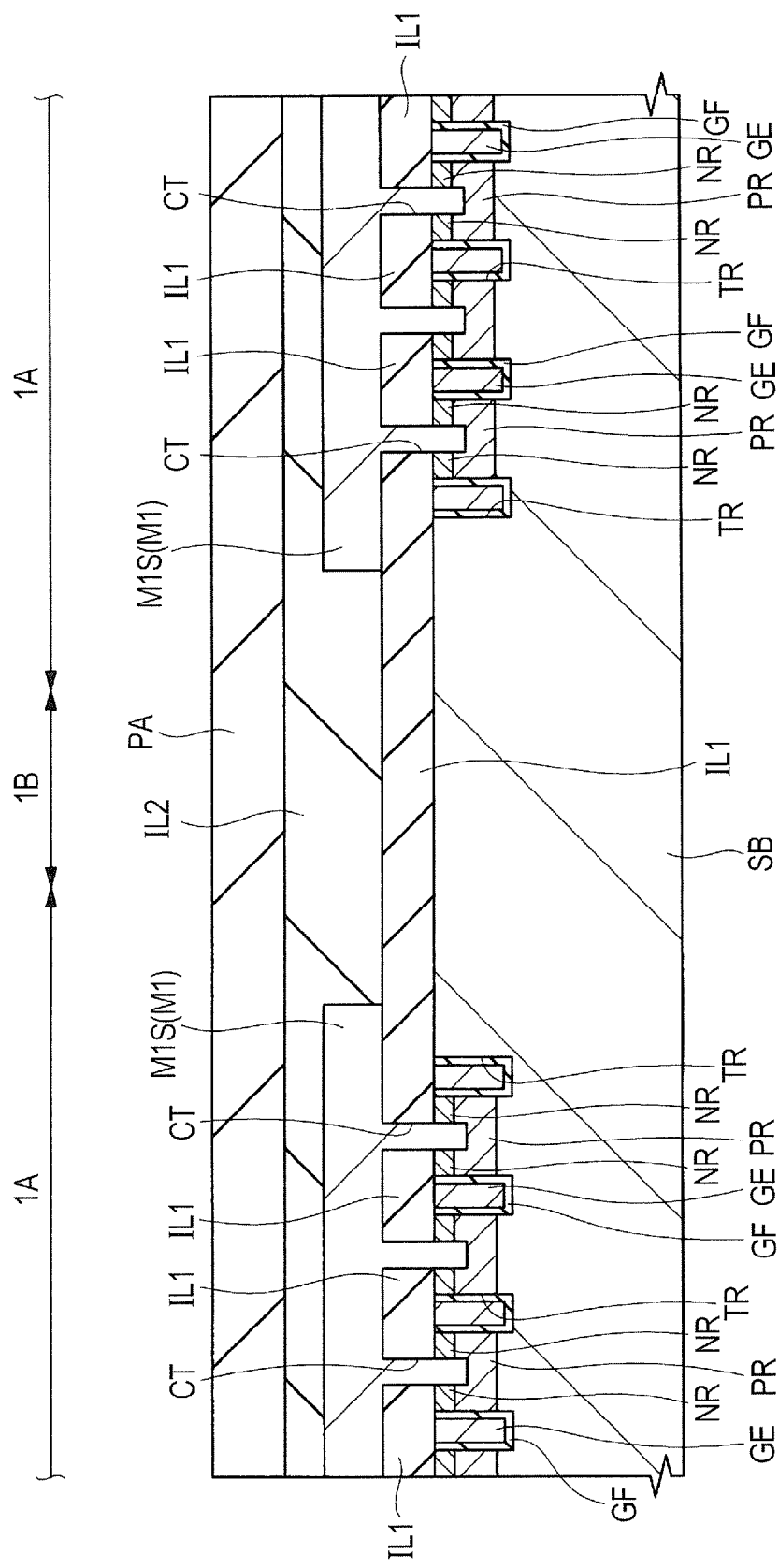
FIG. 12 is an important portion cross-sectional view in the manufacturing process of the semiconductor device, following FIG. 11.

As shown in FIG. 12, an insulating film IL2 is formed on the main surface (the whole main surface) of the semiconductor substrate SB or on the insulating film IL1, to cover the wiring M1 (source wiring M1S and gate wiring). The insulating film IL2 is made of silicon oxide film or silicon nitride film.

Then, an insulating film PA is formed on the main surface (the whole main surface) of the semiconductor substrate SB or on the insulating film IL2. The insulating film PA is made of resist film, for example, polyimide based resin film, provided with a surface protection function. The insulating film IL2 can be omitted if necessary. At the point of forming the insulating film PA, the whole wiring M1 is covered with the insulating film PA.

Figure 13:
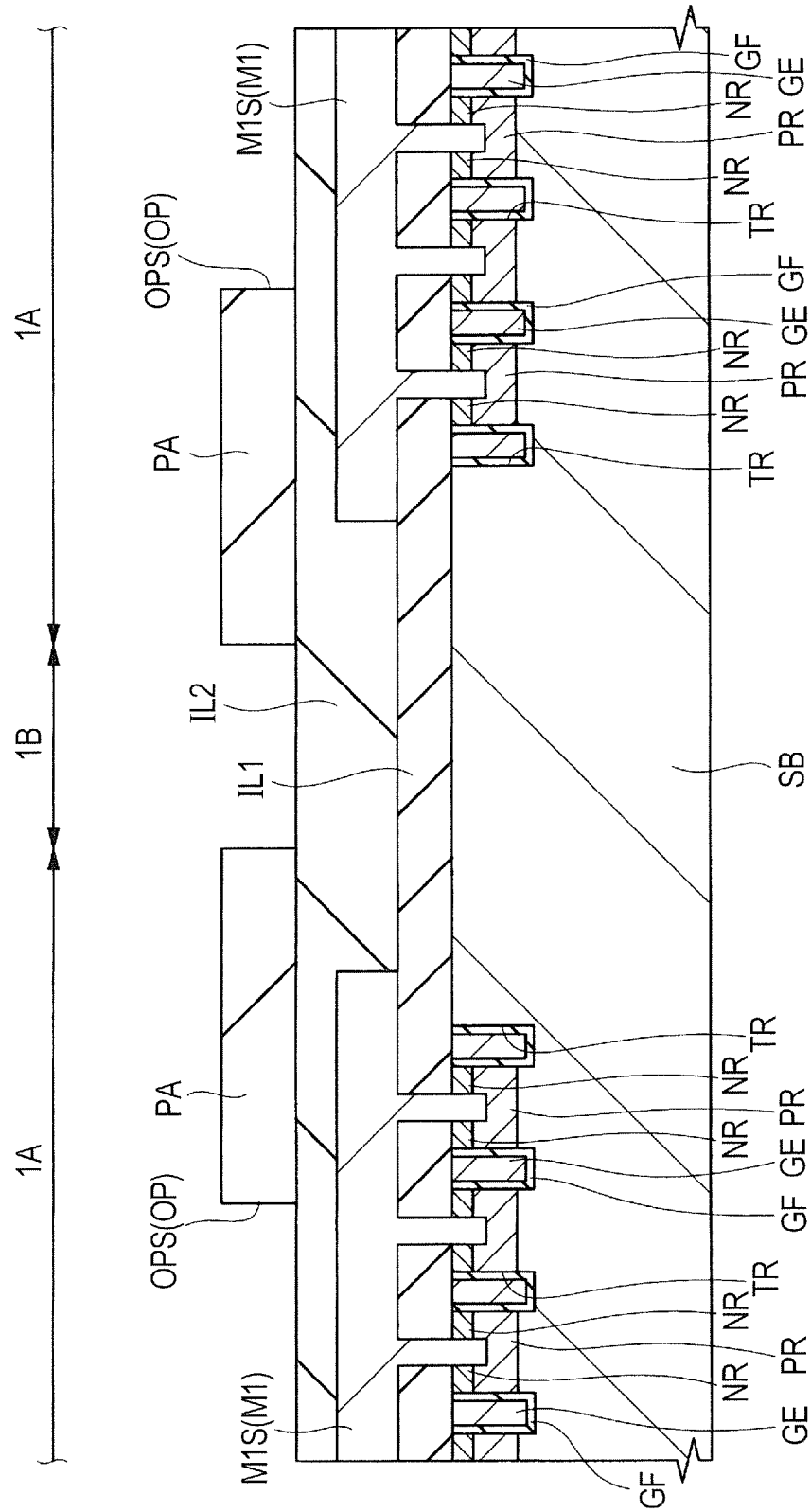
FIG. 13 is an important portion cross-sectional view in the manufacturing process of the semiconductor device, following FIG. 12.

As shown in FIG. 13, the insulating film PA is patterned, hence to form an opening portion OP in the insulating film PA in the semiconductor device region 1A and to eliminate the insulating film PA in the scribe region 1B.

The insulating film PA is patterned in a way of forming the insulating film PA as a photosensitive resin film, forming a photoresist pattern (not illustrated) on the insulating film PA made of photosensitive resin, performing exposure and development on the insulating film PA made of the photosensitive resin, and selectively eliminating the insulating film PA in the portion corresponding to the opening portion OP and the insulating film PA in the scribe region 1B. Alternatively, it is done in a way of forming the photoresist pattern (not illustrated) on the insulating film PA, etching the insulating film PA with the photoresist pattern used as the etching mask, and selectively eliminating the insulating film PA in the portion corresponding to the opening portion OP and the insulating film PA in the scribe region 1B.

Figure 14:
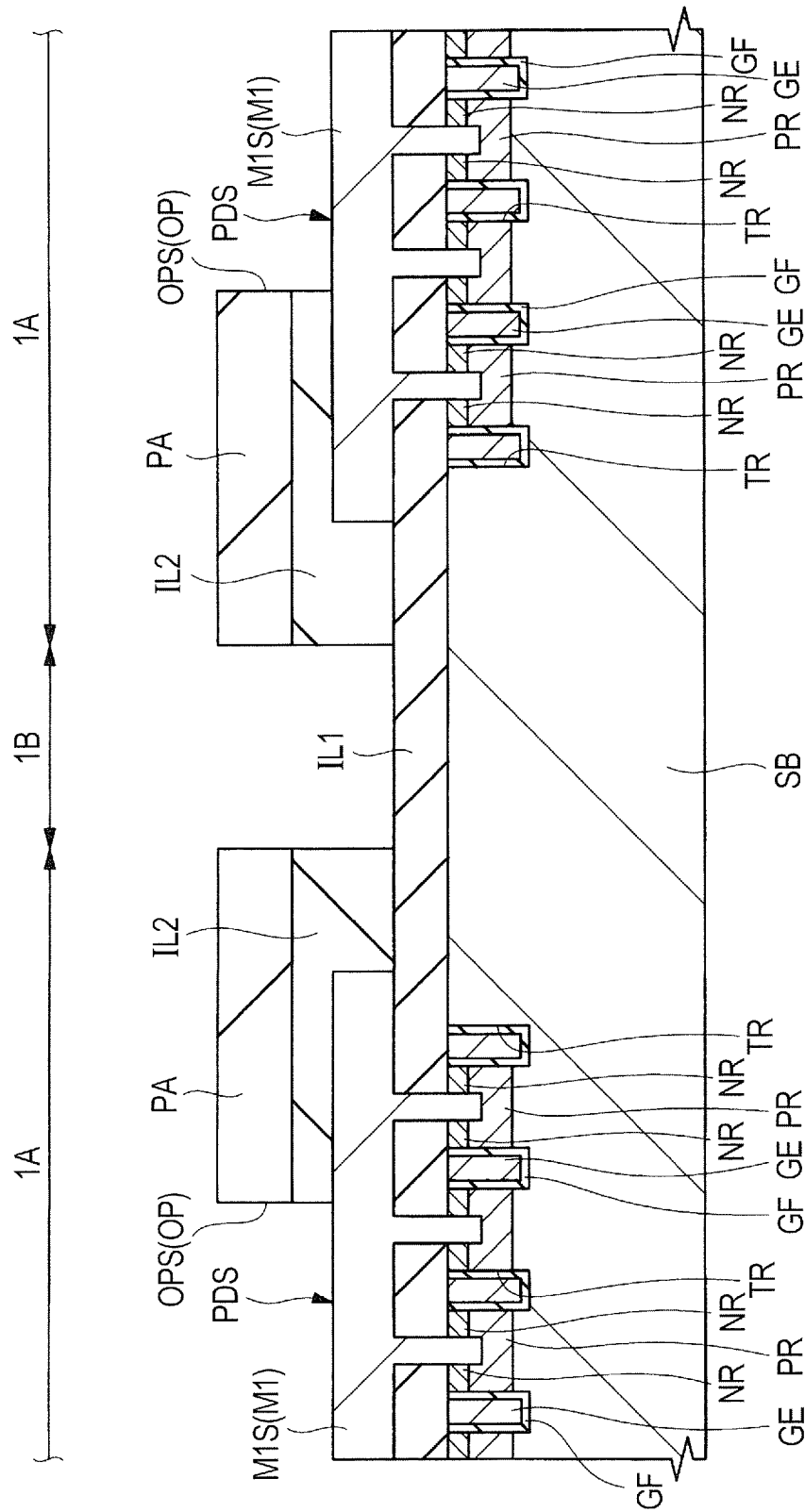
FIG. 14 is an important portion cross-sectional view in the manufacturing process of the semiconductor device, following FIG. 13.
Figure 15:
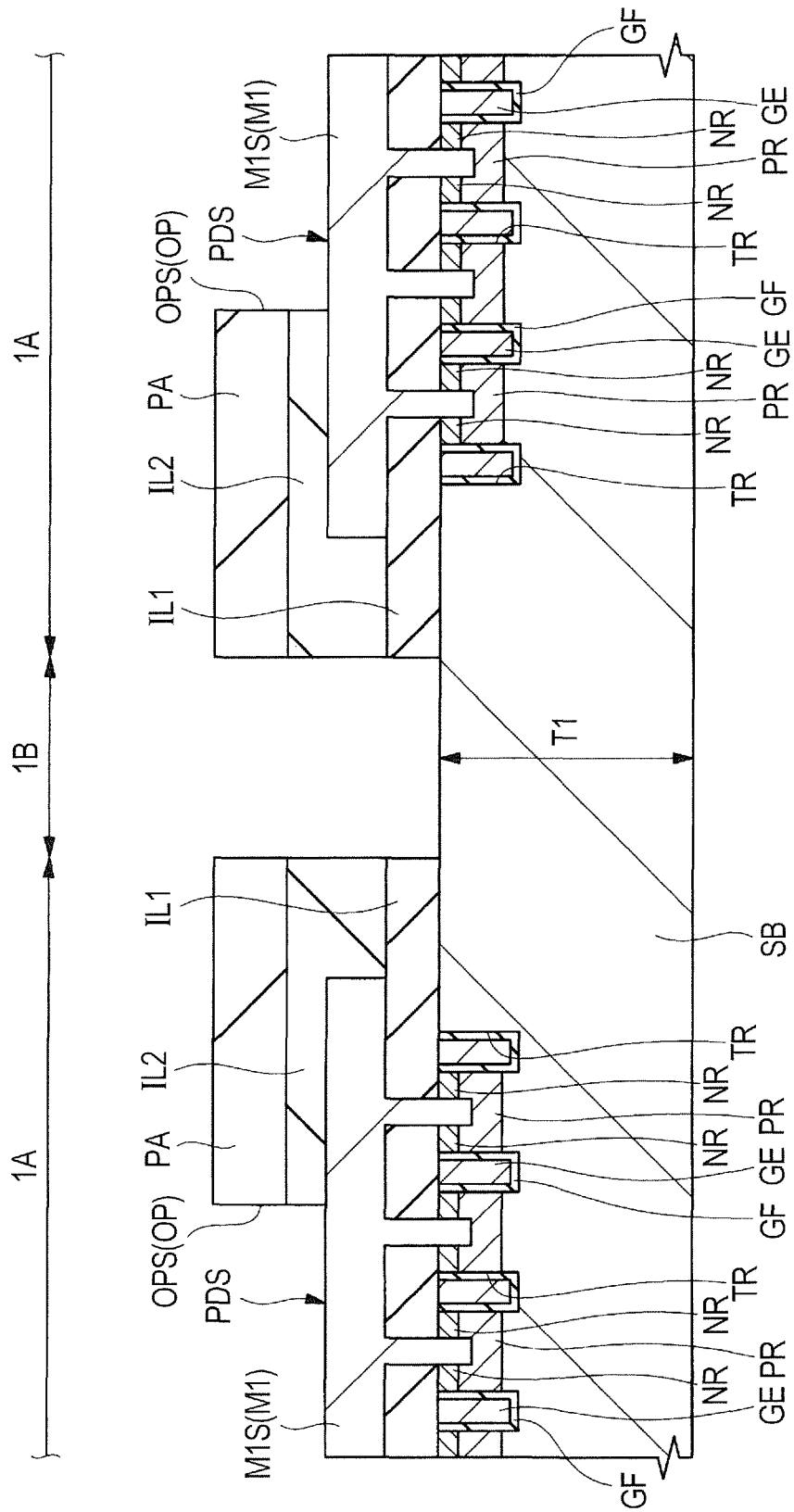
FIG. 15 is an important portion cross-sectional view in the manufacturing process of the semiconductor device, following FIG. 14.

As shown in FIG. 14, the insulating film PA is used as the etching mask to etch the insulating film IL2, hence to selectively eliminate the insulating film IL2 in the portion bared from the opening portion OP of the insulating film PA and the insulating film IL2 in the scribe region 1B. Then, as shown in FIG. 15, the insulating film PA is used as the etching mask to etch the insulating film IL1, hence to selectively eliminate the insulating film IL1 in the scribe region 1B. According to this, as shown in FIG. 15, the opening portion OP is formed in a film stack of the insulating film PA and the insulating film IL2, and simultaneously the insulating film PA, the insulating film IL2, and the insulating film IL1 in the scribe region 1B are eliminated. The opening portion OP is formed in the semiconductor device region 1A and a part of the wiring M1 is bared from the opening portion OP.

The opening portion OP includes the opening portion for source OPS and the opening portion for gate OPG. The opening portion for source OPS is shown in FIGS. 15 and 1; however, the opening portion for gate OPG is not shown in FIG. 15 but shown in FIG. 1. The opening portion for source OPS and the opening portion for gate OPG are not coupled together, at a distance. The opening portion for source OPS formed on the source wiring M1S bares a part of the source wiring M1S. The opening portion for gate OPG formed on the gate wiring bares a part of the gate wiring.

According to this, a bonding pad (pad for source PDS and pad for gate PDG) is formed on the top surface of the semiconductor device CP. In other words, the source wiring M1S portion bared from the opening portion OP of the insulating films PA and IL2 forms the pad for source PDS that is a bonding pad for source. Further, the gate wiring portion bared from the opening portion OP of the insulating films PA and IL2 forms the pad for gate PDG that is a bonding pad for gate.

According to this, the semiconductor element is formed on the semiconductor substrate SB and the wiring structure is formed on the semiconductor substrate SB (Step S2 in FIG. 3). The processes of FIGS. 5 to 15 correspond to Step S2 in FIG. 3.

As the characteristic point, in the scribe region 1B, the insulating film PA, the insulating film IL2, and the insulating film IL1 are eliminated, to bare the top surface (main surface) of the semiconductor substrate SB. Here, the above characteristic structure is obtained in a way of eliminating the insulating film PA, the insulating film IL2, and the insulating film IL1 in the scribe region 1B after forming the insulating film PA; however, another way can be used. For example, after forming the insulating film IL1, before forming the insulating film IL2, the insulating film IL1 in the scribe region 1B may be eliminated, and then, after forming the insulating film PA, the insulating film PA and the insulating film IL2 in the scribe region 1B may be eliminated. Further, after forming the insulating film IL2, before forming the insulating film PA, the insulating film IL2 in the scribe region 1B may be eliminated and then after forming the insulating film PA, the insulating film PA and the insulating film IL1 in the scribe region 1B may be eliminated. Further, after forming the insulating film IL1, before forming the insulating film IL2, the insulating film IL1 in the scribe region 1B may be eliminated, then, after forming the insulating film IL2, the insulating film IL2 in the scribe region 1B may be eliminated, and then, after forming the insulating film PA, the insulating film PA in the scribe region 1B may be eliminated. In either way, in the stage of finishing Step S2, the insulating film PA, the insulating film IL2, and the insulating film IL1 are eliminated in the scribe region 1B and the top surface (main surface) of the semiconductor substrate SB is bared.

The wiring structure is formed on the semiconductor substrate SB; the wiring structure includes one or more wiring layers (here, the wiring M1) and one or more insulating films (here, the insulating films IL1, IL2, and PA). Here, the description has been made when the number (the number of the layers) of the wiring layers included in the wiring structure formed on the semiconductor substrate SB is one layer; however, it is not restricted to this but the number of the wiring layers (the number of the layers) included in the wiring structure formed on the semiconductor substrate SB may be two or more. Here, the description has been made when the number (the number of the layers) of the insulating films included in the wiring structure formed on the semiconductor substrate SB is three layers; however, it is not restricted to this but the number (the number of the layers) of the insulating films included in the wiring structure formed on the semiconductor substrate SB may be any other number than three. Here, generally, the wiring structure formed on the semiconductor substrate SB includes a plurality of layers (two or more layers) of the insulating films.

It is important that the wiring structure including one or more wiring layers and one or more insulating films is formed on the semiconductor substrate SB, the wiring structure is formed in the semiconductor device region 1A on the semiconductor substrate SB but that the wiring and the insulating film forming the wiring structure are not formed in the scribe region 1B on the semiconductor substrate SB.

In the embodiment, in Step S1, the semiconductor substrate SB having the semiconductor device region 1A surrounded by the scribe region 1B in plan view is prepared; in Step S2, the semiconductor element (here, the trench gate MISFET) is formed on the semiconductor substrate SB in the semiconductor device region 1A and the wiring structure is formed on the main surface (top surface) of the semiconductor substrate SB in the semiconductor device region 1A. The wiring structure formed in Step S2 includes one or more wiring layers (here, the wiring M1) and one or more insulating films (here, the insulating films IL1, IL2, and PA); while, in the stage after finishing Step S2, the insulating films (here, the insulating films IL1, IL2, and PA) included in the wiring structure are not formed on the main surface (top surface) of the semiconductor substrate SB in the scribe region 1B. Accordingly, in the stage after finishing Step S2, the wiring structure including one or more wiring layers and one or more insulating films is formed in the semiconductor device region 1A on the semiconductor substrate SB; the above insulating film and wiring in the wiring structure are not formed in the scribe region 1B on the semiconductor substrate SB but the semiconductor substrate SB is bared in the scribe region 1B.

Figure 16:
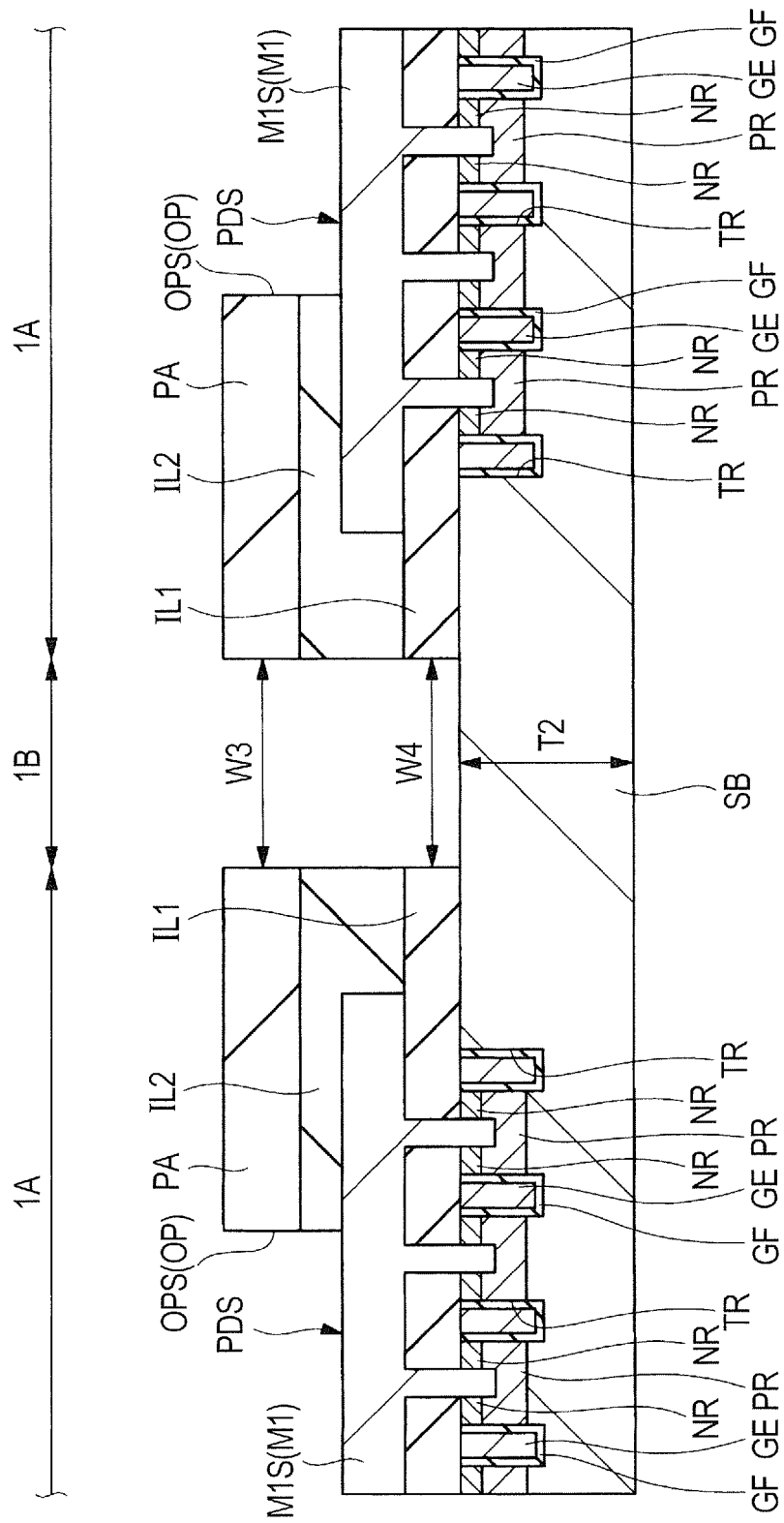
FIG. 16 is an important portion cross-sectional view in the manufacturing process of the semiconductor device, following FIG. 15.

As shown in FIG. 16, the back surface (the opposite surface to the main surface with the trenches TR formed) of the semiconductor substrate SB is polished or ground to thin the semiconductor substrate SB (Step S3 in FIG. 3). The polishing (or grinding) process for thinning the semiconductor substrate SB is hereinafter to be referred to as "back polishing process in Step S3" or simply "Step S3". In the back polishing (back grinding) process in Step S3, the whole back surface of the semiconductor substrate SB is polished (ground).

FIG. 15 shows the state before the back polishing process in Step S3, and FIG. 16 shows the state after the back polishing process in Step S3. The thickness T2 of the semiconductor substrate SB after the back polishing process in Step S3 (refer to FIG. 16) is smaller than the thickness T1 thereof before the back polishing process in Step S3 (refer to FIG. 15) (in short, T2<T1).

Figure 17:
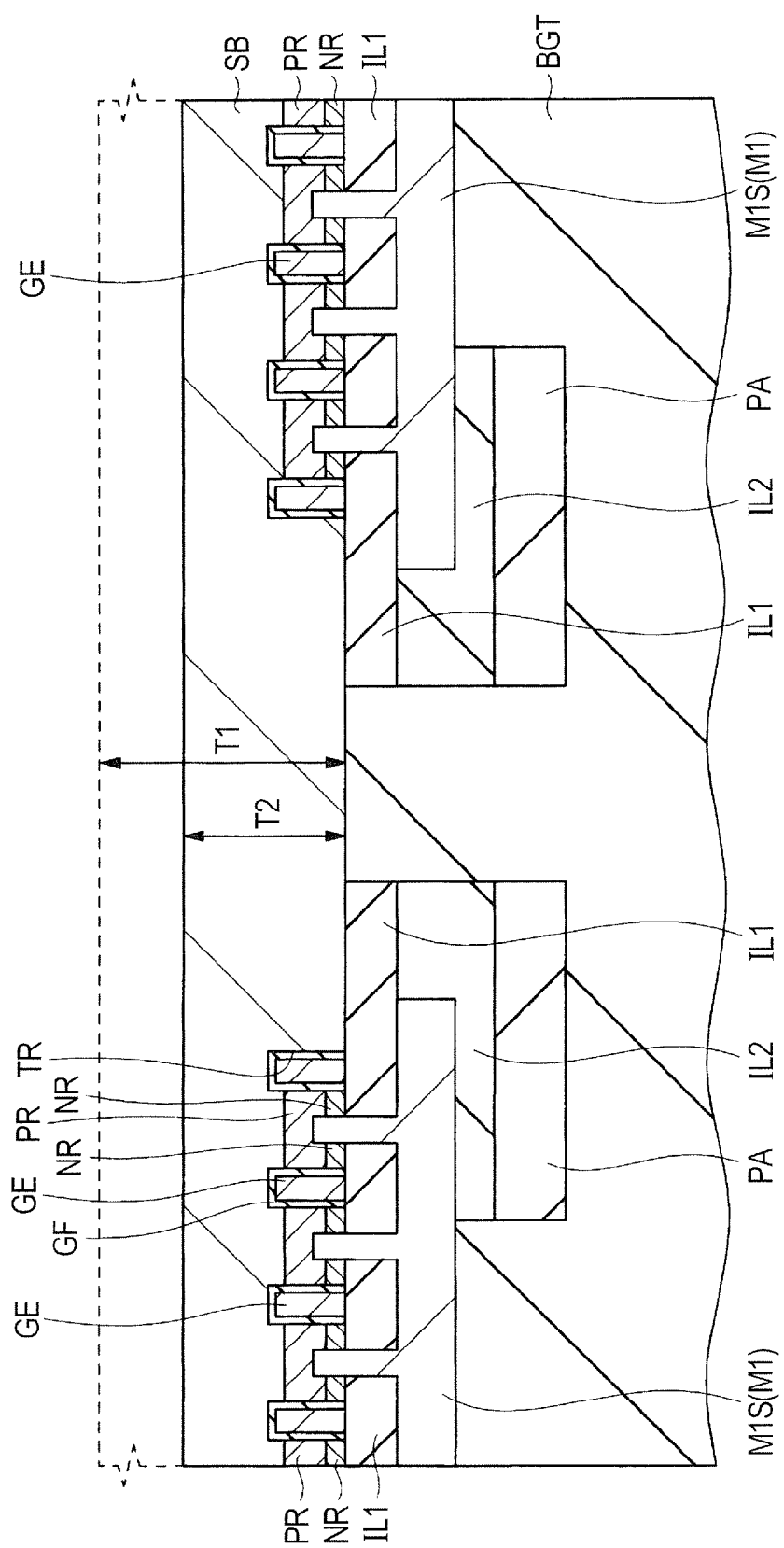
FIG. 17 is a view for use in describing a back surface polishing process of the semiconductor substrate.

The back polishing process in Step S3 can be performed, for example, in the following way. FIG. 17 is a view for use in describing the back polishing process of the semiconductor substrate SB in Step S3, showing the cross section corresponding to FIGS. 15 and 16. As shown in FIG. 17, a protective tape (back grinding tape) BGT is attached to the top surface of the semiconductor substrate SB (the main surface with the trenches TR, the insulating films IL1, IL2, and PA formed), and the semiconductor substrate SB is fixed to a wafer table (not illustrated) through this protective tape BGT. Here, as shown in FIG. 17, the back surface of the semiconductor substrate SB is being bared upwardly. While rotating the semiconductor substrate SB, a grinding material (such as grindstone) is pushed to the back surface of the semiconductor substrate SB, to polish the whole back surface of the semiconductor substrate SB in order to thin the semiconductor substrate SB. After finishing the polishing, cleaning is performed and then, the semiconductor substrate SB and the protective tape BGT are separated. According to this, the back polishing process in Step S3 is performed.

Before the back polishing process in Step S3, the thickness (T1) of the semiconductor substrate SB is, for example, about 200 to 1000 μm; after the back polishing process in Step S3, the thickness (T2) of the semiconductor substrate SB is, for example, 100 μm and less (about 50 to 100 μm).

After thinning the semiconductor substrate SB through the polishing process of the semiconductor substrate SB, the thickness (T2) of the semiconductor substrate SB is measured (Step S4 in FIG. 3). The process of measuring the thickness (T2) of the semiconductor substrate SB is hereinafter to be referred to as "thickness measuring process in Step S4" or simply "Step S4".

Figure 18:
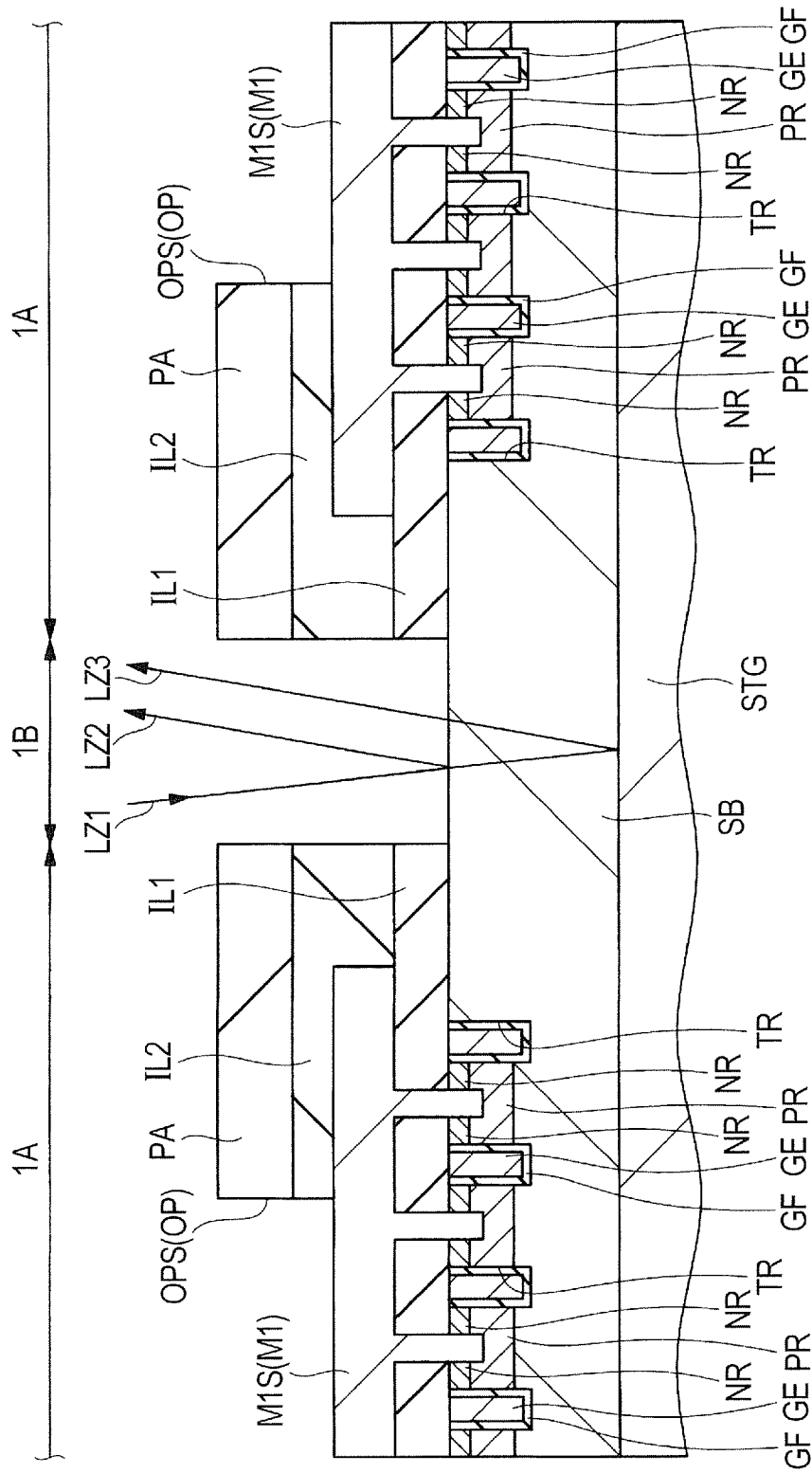
FIG. 18 is a view for use in describing a thickness measuring process of the semiconductor substrate.

FIG. 18 is a view for use in describing the thickness measuring process of the semiconductor substrate SB in Step S4, showing the cross section corresponding to FIG. 16. In the case of FIG. 18, a laser light is used to measure the thickness (T2) of the semiconductor substrate SB. In short, a laser interferometry (laser interference typed measuring method) is used to measure the thickness (T2) of the semiconductor substrate SB.

Specifically, as shown in FIG. 18, the top surface (main surface) of the semiconductor substrate SB arranged on a wafer stage STG is irradiated with a laser light LZ1, and by using an interference wave generated by the reflection wave LZ2 on the top surface (main surface) of the semiconductor substrate SB and the reflection wafer LZ3 on the back surface thereof, the thickness (T2) of the semiconductor substrate SB can be measured.

Here, the characteristic point is that the thickness (T2) of the semiconductor substrate SB is measured in the scribe region 1B where the insulating films IL1, IL2, and PA are not formed. Therefore, as shown in FIG. 18, the laser light LZ1 irradiates the semiconductor substrate SB in the scribe region 1B where the insulating films IL1, IL2, and PA are not formed. In other words, the bared surface of the semiconductor substrate SB in the scribe region 1B is irradiated with the laser light LZ1. Although the details will be described later, in the embodiment, the thickness (T2) of the semiconductor substrate SB is measured in the scribe region 1B where the main surface (top surface) of the semiconductor substrate SB is bared without the insulating films IL1, IL2, and PA; therefore, the thickness (T2) of the semiconductor substrate SB can be measured accurately. In Step S3, after polishing the back surface of the semiconductor substrate SB, Step S4 is performed and therefore, in Step S4, the back surface (whole back surface) of the semiconductor substrate SB is bared.

Figure 19:
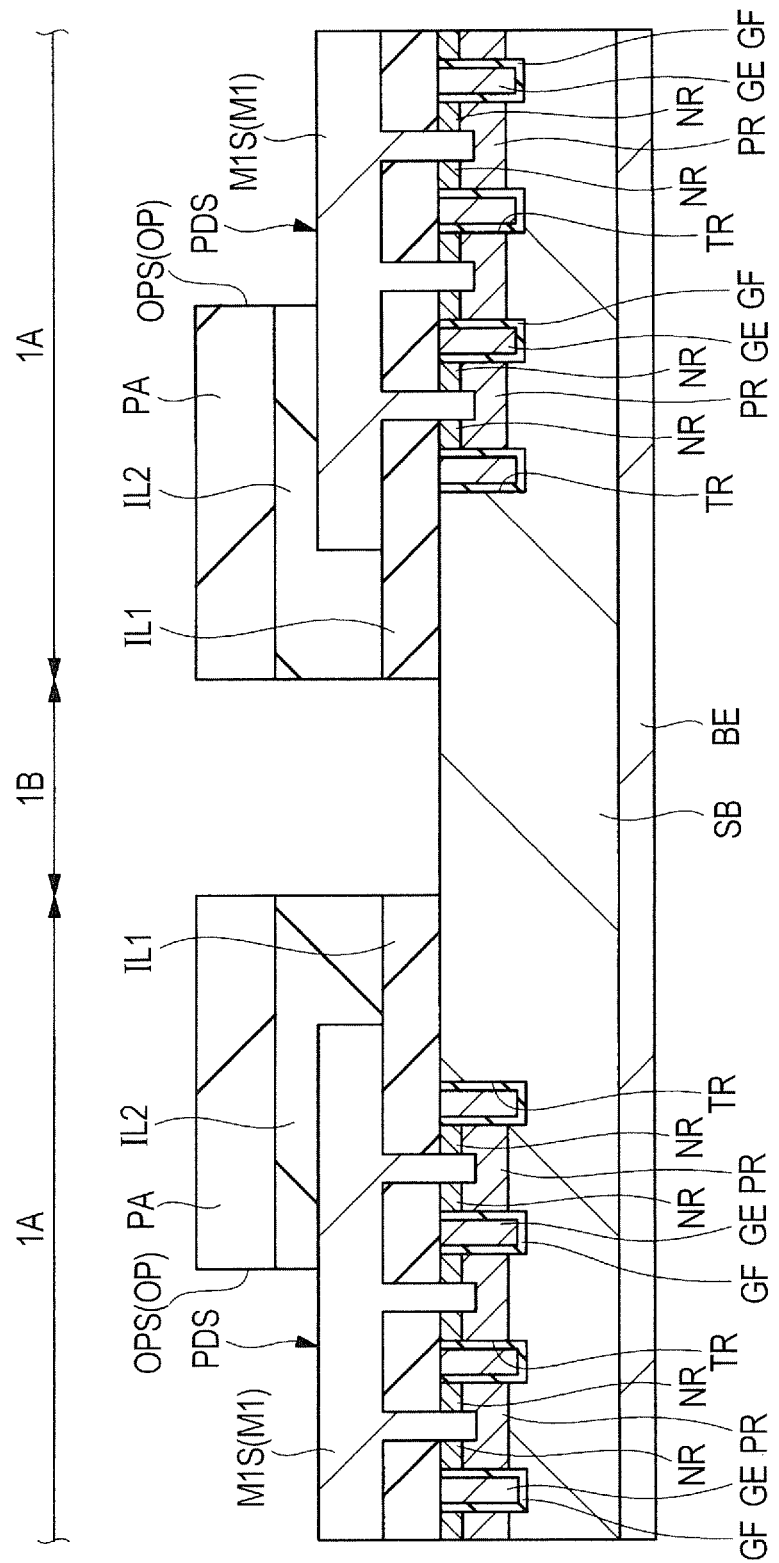
FIG. 19 is an important portion cross-sectional view in the manufacturing process of the semiconductor device, following FIGS. 16 to 18.

Next, as shown in FIG. 19, the back electrode BE is formed on the whole back surface of the semiconductor substrate SB (Step S5 in FIG. 3). The back electrode BE forming process is hereinafter to be referred to "back electrode BE forming process in Step S5" or simply "Step S5". The back electrode BE is made by a stack metal film of, for example, aluminum (Al), titanium (Ti), nickel (Ni), and gold (Au) from the side nearer to the back surface of the semiconductor substrate SB, for example, according to the vapor deposition.

Figure 20:
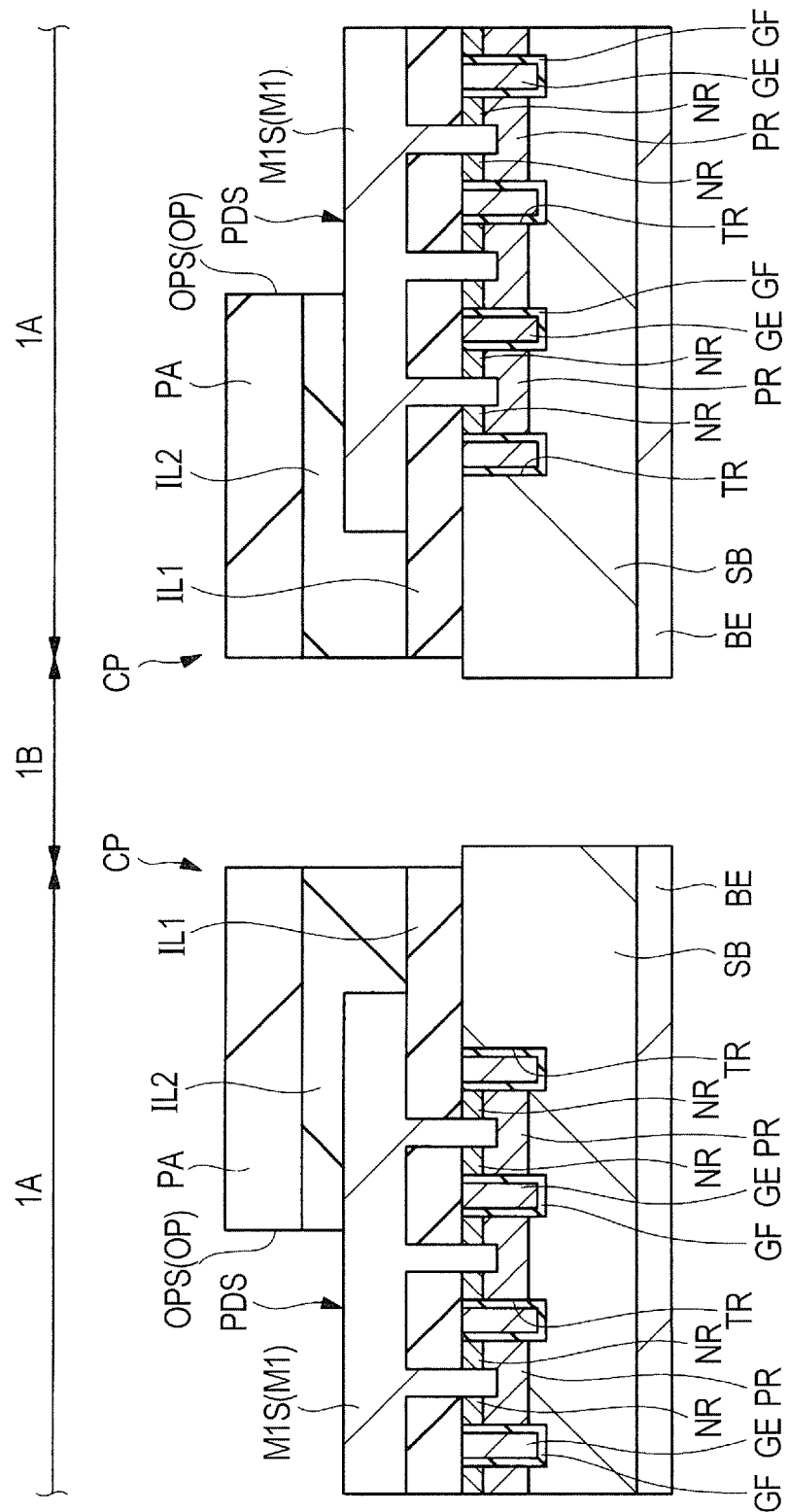
FIG. 20 is an important portion cross-sectional view in the manufacturing process of the semiconductor device, following FIG. 19.

Next, as shown in FIG. 20, the semiconductor substrate SB is divided (separated and cut) through dicing, hence to obtain the individual semiconductor chips (semiconductor devices CP) from the semiconductor substrate SB (Step S6 in FIG. 3). This process is hereinafter to be referred to "dicing process in Step S6" or simply "Step S6".

Figure 21:
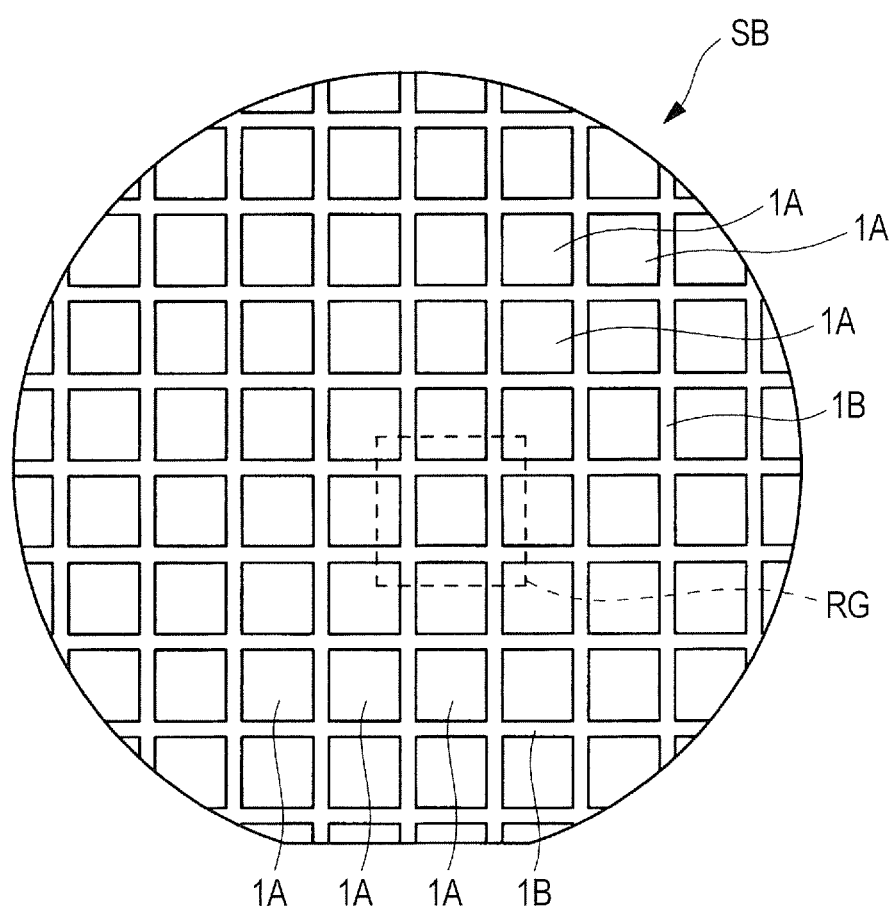
FIG. 21 is a top plan view schematically showing the whole semiconductor substrate in the stage before performing the dicing process.
Figure 22:
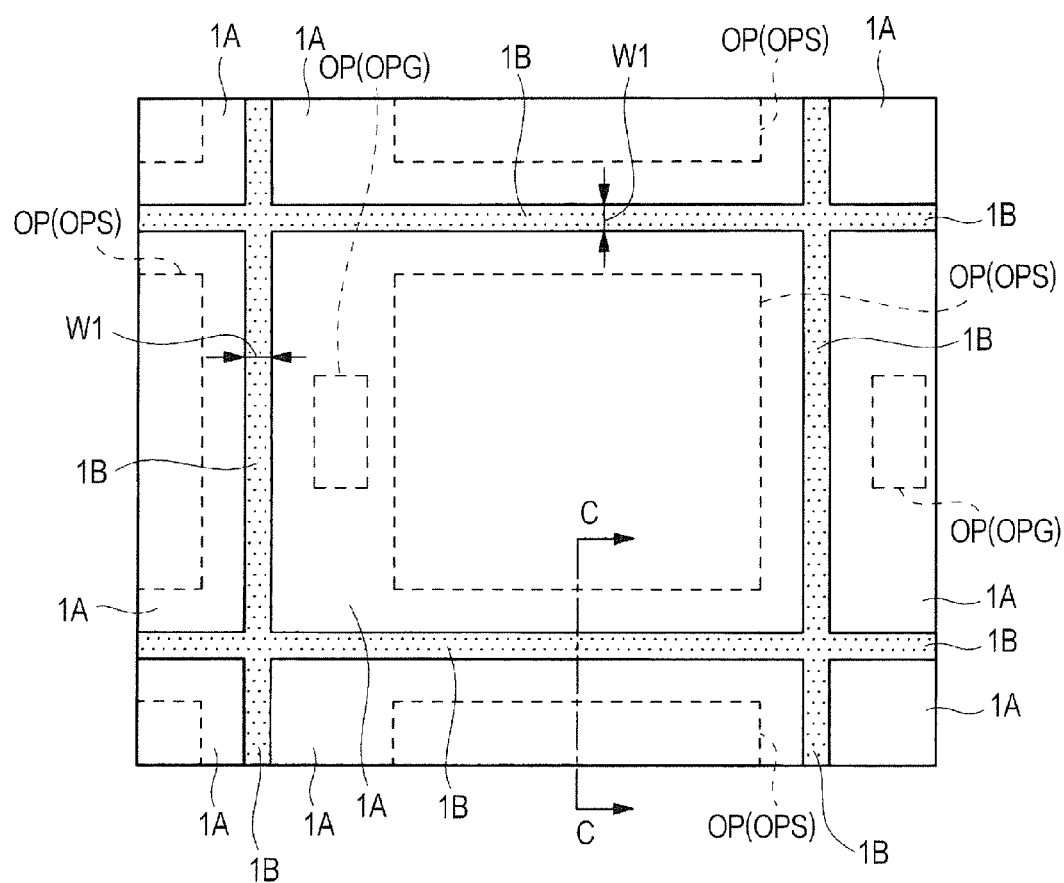
FIG. 22 is a partially-enlarged top plan view showing a part of FIG. 21 in an enlarged way.

FIG. 21 is a top plan view (whole top plan view) schematically showing the whole semiconductor substrate SB in the stage before the dicing process in Step S6, corresponding to the same stage as in FIG. 19. Further, FIG. 22 is a partially enlarged top plan view showing a part of FIG. 21 in an enlarged way, or a region RG surrounded by the dotted line in FIG. 21 in an enlarged way. In FIG. 22, the position of the opening portion OP (the opening portion for source OPS and the opening portion for gate OPG) is indicated by the dotted line. FIG. 22 is a top plan view; for the sake of easy understanding, dotted hatching is given to a portion where the top surface of the semiconductor substrate SB is bared with the insulating films IL1, IL2, and PA eliminated. As apparent from FIGS. 19 and 22, in the almost whole scribe region 1B, the insulating films IL1, IL2, and PA are eliminated to bare the top surface of the semiconductor substrate SB. The cross-sectional view taken along the line C-C in FIG. 22 almost corresponds to FIG. 19. In short, the cross sections shown in FIGS. 4 to 20 almost correspond to the cross section taken along the line C-C in FIG. 22.

As shown in FIGS. 21 and 22, a plurality of semiconductor device regions 1A are arranged on the main surface of the semiconductor substrate SB in an array (matrix). The space between the adjacent semiconductor device regions 1A is the scribe region 1B in plan view; each of the semiconductor device regions 1A is surrounded by the scribe region 1B in plan view.

In the dicing process in Step S6, the semiconductor substrate SB is cut (diced) by using a dicing saw (dicing blade) along the scribe region 1B between the semiconductor device regions 1A. According to this, the semiconductor substrate SB is cut and separated into the individual semiconductor device regions 1A (semiconductor devices CP). The individualized semiconductor device regions 1A become the respective semiconductor devices CP.

In the embodiment, the insulating films IL1, IL2, and PA are eliminated in the whole scribe region 1B; therefore, the dicing process in Step S6 is advantageously performed easily only by cutting the semiconductor substrate SB along the scribe region 1B using the dicing saw with no need to cut the insulating films IL1, IL2, and PA.

As mentioned above, the semiconductor device CP according to the embodiment is manufactured.

In the semiconductor device CP, a vertical transistor such as a trench gate MISFET is formed as the semiconductor element. Specifically, a plurality of unit transistor cells are formed in a predetermined region (transistor cell region) of the semiconductor substrate SB forming the semiconductor device CP, and a power transistor is formed by coupling the unit transistor cells in parallel. Each of the unit transistor cells is formed by the trench gate MISFET. The source regions (here, the above n+ type semiconductor region NR) of the plural unit transistor cells (trench gate MISFET) formed on the semiconductor substrate SB forming the semiconductor device CP are electrically coupled to the common source wiring M1S. The gate electrodes (GE) of the plural unit transistor cells (trench gate MISFET) formed on the semiconductor substrate SB forming the semiconductor device CP are electrically coupled to the common gate wiring (pad for gate PDG). The drain regions (n type substrate region under the p type semiconductor region PR) of the plural unit transistor cells (trench gate MISFET) formed on the semiconductor substrate SB forming the semiconductor device CP are electrically coupled to the common drain electrode (corresponding to the back electrode BE).

The trench gate MISFET is a MISFET having a trench gate structure (gate electrode structure embedded in a trench formed in the substrate). Further, the vertical transistor corresponds to a transistor in which the operation current flows in a thickness direction of the semiconductor substrate (SB) (in a direction substantially vertical to the main surface of the semiconductor substrate).

Here, the case of applying the trench gate MISFET to the semiconductor element formed on the semiconductor substrate SB in the semiconductor device region 1A has been described; however, it is not restricted to this but another type of semiconductor element may be formed on the semiconductor substrate SB in the semiconductor device region 1A.

For example, instead of the trench gate MISFET, IGBT can be formed on the semiconductor substrate SB in the semiconductor device region 1A. In the case of using the IGBT, a semiconductor region for collector (p type semiconductor region) is formed on the back surface of the semiconductor substrate SB. In the case of using the IGBT, the back electrode BE works as the collector electrode, the above n+ type semiconductor region NR works as a semiconductor region for emitter, the source wiring M1S works as the emitter wiring, and the pad for source PDS works as the emitter pad.

Alternatively, Laterally Diffused Metal-Oxide-Semiconductor Field Effect Transistor (LDMOSFET) can be formed on the semiconductor substrate SB in the semiconductor device region 1A, instead of the trench gate MISFET.

In either case, the semiconductor element is formed on the semiconductor substrate SB in the semiconductor device region 1A, the wiring structure is formed on the main surface (top surface) of the semiconductor substrate SB, and the back electrode (BE) is formed on the back surface (the whole back surface) thereof. This enables a current between the terminal (the terminal corresponding to the pad for source PDS) on the side of the top surface of the semiconductor device CP and the back electrode (BE) on the side of the back surface thereof.

BACKGROUND OF INVESTIGATION

Next, the background of the investigation by the inventor et al. will be described.

In manufacturing a semiconductor device (semiconductor chip) having a back electrode, a semiconductor substrate is thinned through the back polishing process of polishing the back surface of the semiconductor substrate, and then, the back electrode is formed on the back surface thereof, hence to obtain the semiconductor devices (semiconductor chips) through the dicing process.

The electric properties of the semiconductor device having the back electrode are affected by the thickness of the semiconductor substrate forming the semiconductor device. When the thickness of the semiconductor substrate forming the semiconductor device is deviated from the design value, the electric properties of the semiconductor device are deviated from the design value. Especially, when such a semiconductor element (power transistor) that runs a current between the terminal on the top surface of the semiconductor device and the back electrode on the back surface thereof is formed in the semiconductor device, the current flows vertically (in the thickness direction of the semiconductor substrate) in the semiconductor substrate forming the semiconductor device; therefore, the thickness of the semiconductor substrate affects the length of the current channel; as the result, when the thickness of the semiconductor substrate is deviated from the design value, the electric properties fluctuate. In order to obtain predetermined electric properties, it is important to control the thickness of the semiconductor substrate in the semiconductor device having the back electrode.

Therefore, it is preferable that after the back polishing process of the semiconductor substrate, the thickness of the semiconductor substrate is measured and that the back electrode is thereafter formed on the back surface of the semiconductor substrate. According to this, after thinning the semiconductor substrate through the back polishing process, the thickness of the semiconductor substrate is measured and after confirming the thickness of the semiconductor substrate to be within a predetermined tolerance, the back electrode can be formed; accordingly, in the manufactured semiconductor device, the thickness of the semiconductor substrate can be within a predetermined tolerance. As the result, the fluctuation of the electric properties of the semiconductor device accompanying the fluctuation of the thickness of the semiconductor substrate can be restrained or inhibited. Further, with the thickness of the semiconductor substrate measured, it is compared with the design value and depending on the difference, the condition (for example, polishing time) of the back polishing process to be performed on the next semiconductor substrate can be adjusted.

However, when the process of measuring the thickness of the semiconductor substrate is performed between the back polishing process and the back electrode forming process, it is found that the following problem happens.

Specifically, in the semiconductor substrate which has been subjected to the back polishing process and is to be subjected to the back electrode forming process, the wiring structure has been formed on the main surface of the semiconductor substrate. On the main surface of the semiconductor substrate, an insulating film included in the wiring structure is formed. In this case, the thickness of the semiconductor substrate is to be measured in a portion with the insulating film formed on the semiconductor substrate.

In the thickness measurement in the portion with the insulating film formed on the semiconductor substrate, the thickness of only the semiconductor substrate is difficult to be measured and the total thickness of the semiconductor substrate and the insulating film provided thereon is to be measured. In this case, it is difficult to obtain the accurate thickness of the semiconductor substrate.

Since the measured value of the total thickness of the semiconductor substrate and the insulating film provided thereon, instead of the thickness of only the semiconductor substrate, is used for controlling the thickness of the semiconductor substrate to a predetermined design value, the thickness of only the semiconductor substrate cannot be estimated accurately and therefore, it is difficult to control the thickness of the semiconductor substrate in the manufactured semiconductor device to the predetermined design value. This means the fluctuation in the thickness of the semiconductor substrate forming the semiconductor device and at the same time, the fluctuation in the electric properties of the semiconductor device, which deteriorates the reliability of the semiconductor device.

With the total thickness of the semiconductor substrate and the insulating film provided thereon measured, the thickness of the insulating film may be subtracted from the measured value to estimate the thickness of only the semiconductor substrate. In this case, however, the obtained thickness of only the semiconductor substrate includes the sum of the measurement error of the total thickness of the semiconductor substrate and the insulating film provided thereon and the measurement error of the thickness of the insulating film; therefore, it is difficult to accurately estimate the thickness of only the semiconductor substrate. Accordingly, it is also difficult to control the thickness of the semiconductor substrate in the manufactured semiconductor device to the predetermined design value, causing the fluctuation in the thickness of the semiconductor substrate forming the semiconductor device and further causing the fluctuation in the electric properties of the semiconductor device, hence to deteriorate the reliability of the semiconductor device.

<Main Characteristics>

In the manufacturing process of a semiconductor device according to the embodiment, in Step S1, the semiconductor substrate SB having the semiconductor device regions 1A surrounded by the scribe region 1B in plan view is prepared; in Step S2, the semiconductor element is formed on the semiconductor substrate SB in the semiconductor device region 1A and the wiring structure is formed on the main surface (top surface) of the semiconductor substrate SB in the semiconductor device region 1A. In Step S3, the back surface of the semiconductor substrate SB is polished to thin the semiconductor substrate SB; in Step S4, the thickness (T2) of the semiconductor substrate SB is measured; in Step S5, the back electrode BE is formed on the back surface of the semiconductor substrate SB; in Step S6, the semiconductor substrate SB is cut along the scribe region 1B.

As one of the main characteristics of the embodiment, with the wiring structure formed on the main surface (top surface) of the semiconductor substrate SB in Step S2 including one or more insulating films, the thickness (T2) of the semiconductor substrate SB is measured in the portion where the main surface (top surface) of the semiconductor substrate SB is bared without any insulating film included in the wiring structure, in Step S4.

In other words, in the case of FIGS. 4 to 20, the wiring structure, which is formed on the main surface of the semiconductor substrate SB in the semiconductor device region 1A, includes the wiring M1 and the insulating films IL1, IL2, and PA. Then, in Step S4, the thickness (T2) of the semiconductor substrate SB is measured in the portion where the main surface of the semiconductor substrate SB is bared without the insulating films IL1, IL2, and PA included in the wiring structure. As the result, in Step S4, it is possible to measure the thickness (T2) of only the semiconductor substrate SB without being affected by the insulating films IL1, IL2, and PA included in the wiring structure and thereby to measure the thickness (T2) of the semiconductor substrate SB accurately.

As mentioned above, after confirming the thickness (T2) of the semiconductor substrate SB to be within a predetermined tolerance, the back electrode BE can be formed in Step S5; therefore, in the manufactured semiconductor device CP, the thickness (T2) of the semiconductor substrate SB can be fixed within the predetermined tolerance. Therefore, it is possible to restrain or inhibit the fluctuation in the thickness (T2) of the semiconductor substrate forming the semiconductor device and as the result, to restrain or inhibit the fluctuation in the electric properties of the semiconductor device CP accompanying the fluctuation in the thickness (T2) of the semiconductor substrate SB. In Step S4, the thickness (T2) of the semiconductor substrate is measured, the measured value thereof is compared with the design thickness, and depending on the difference, the condition (for example, polishing time) of the back polishing process (Step S3) to be performed on the next semiconductor substrate also can be adjusted. Therefore, it is possible to restrain or inhibit the fluctuation in the thickness (T2) of the semiconductor substrate forming the semiconductor device and as the result, to restrain or inhibit the fluctuation in the electric properties of the semiconductor device CP accompanying the fluctuation in the thickness (T2) of the semiconductor substrate SB. Accordingly, reliability of the manufactured semiconductor device CP can be improved. Further, the manufacturing yield of the semiconductor device CP can be improved.

In the embodiment, the thickness (T2) is measured in Step S4 on the semiconductor substrate SB (wafer for production) for obtaining a production chip (semiconductor device CP) not on a dummy semiconductor substrate (wafer for inspection) which does not produce production chips. Therefore, the thickness (T2) of the semiconductor substrate SB in the manufactured semiconductor device CP can be accurately controlled to a predetermined thickness, hence to improve the reliability of the semiconductor device CP. Further, the manufacturing yield of the semiconductor device CP can be improved.

Further, in the embodiment, the thickness (T2) of the semiconductor substrate SB is measured in the portion (first region) where the main surface (top surface) of the semiconductor substrate SB is based without forming the insulating films (here, the insulating films IL1, IL2, and PA) included in the wiring structure and the measured portion (the first region) is preferably positioned within the scribe region 1B.

In other words, the portion for measuring the thickness (T2) of the semiconductor substrate SB in Step S4 is the bared portion of the semiconductor substrate SB where the insulating films included in the wiring structure are not formed; if this portion is positioned within the semiconductor device region 1A, a wasteful space where any element and wiring can not be formed will be generated in the semiconductor device region 1A, which causes an increase in the plane dimension (flat area) of the semiconductor device region 1A. This increase in the plane dimension (flat area) of the manufactured semiconductor device CP is defective in downsizing the semiconductor device CP. Further, the possible number of the semiconductor devices CP obtained from one sheet of the semiconductor substrate (semiconductor wafer) is reduced, which causes an increase in the manufacturing cost of the semiconductor device CP.

On the other hand, the scribe region 1B is the portion cut off in Step S6 and not left within the manufactured semiconductor device CP. As described in the embodiment, when the portion for measuring the thickness (T2) of the semiconductor substrate SB in Step S4 is positioned within the scribe region 1B, even if the insulating films included in the wiring structure are not formed in the above portion, it has no effect on the structure of the semiconductor device region 1A and accordingly, it has also no effect on the structure of the manufactured semiconductor device CP. In short, any wasteful space impossible to form any element and wiring is not generated within the semiconductor device region 1A. Therefore, the plane dimension (flat area) of the semiconductor device region 1A can be restrained and accordingly, the plane dimension (flat area) of the manufactured semiconductor device CP can be restrained, which is effective at downsizing the semiconductor device CP. Further, the possible number of the semiconductor devices CP obtained from one sheet of the semiconductor substrate (semiconductor wafer) can be increased, hence to restrain the manufacturing cost of the semiconductor device CP.

In the embodiment, in the stage of finishing Step S2 (in the stage just before performing the back polishing process in Step S3), it is preferable that the insulating films (here, the insulating films IL1, IL2, and PA) included in the wiring structure formed on the semiconductor substrate SB in the semiconductor device region 1A are not formed on the main surface (top surface) of the semiconductor substrate SB in the scribe region 1B. In Step S4, it is preferable that the thickness (T2) of the semiconductor substrate SB is measured in the scribe region 1B.

As mentioned above, even when the insulating films (here, the insulating films IL1, IL2, and PA) included in the wiring structure are not formed in the scribe region 1B, it has no effect on the structure of the semiconductor device region 1A, and the wasteful space impossible to form any element and wiring cannot be generated in the semiconductor device region 1A, which can restrain the plane dimension (flat area) of the manufactured semiconductor device CP and be effective at downsizing of the semiconductor device CP. In Step S4, the thickness (T2) of the semiconductor substrate SB is measured in the scribe region 1B where the insulating films (here, the insulating films IL1, IL2, and PA) included in the wiring structure are not formed; therefore, the thickness (T2) of the semiconductor substrate SB can be accurately measured without influence from the insulating films (here, the insulating films IL1, IL2, and PA) included in the wiring structure. As the result, it is possible to restrain or inhibit the fluctuation in the electric properties of the semiconductor device CP accompanying the fluctuation in the thickness (T2) of the semiconductor substrate SB and to improve the reliability of the manufactured semiconductor device CP. Further, it is possible to improve the manufacturing yield of the semiconductor device CP.

As a modified example of the embodiment, not in the whole scribe region 1B but in a part of the scribe region 1B, the insulating films (here, the insulating films IL1, IL2, and PA) included in the wiring structure are eliminated to bare the main surface (top surface) of the semiconductor substrate SB, and in the above region, the thickness (T2) of the semiconductor substrate SB may be measured in Step S4. In this case, in the stage of finishing Step S2, the bared portion of the main surface (top surface) of the semiconductor substrate SB without the insulating films (here, the insulating films IL1, IL2, and PA) included in the wiring structure is a part of the scribe region 1B, and in the other portion of the scribe region 1B, one or more layers of the insulating films (here, the insulating films IL1, IL2, and PA) included in the wiring structure are formed on the semiconductor substrate SB. In this case, in Step S4, the thickness (T2) of the semiconductor substrate SB is measured in the bared portion of the main surface of the semiconductor substrate SB without forming the insulating films (here, the insulating films IL1, IL2, and PA) included in the wiring structure, of the scribe region 1B.

However, it is more preferable that the main surface (top surface) of the semiconductor substrate SB is bared with the insulating films (here, the insulating films IL1, IL2, and PA) included in the wiring structure eliminated, in the whole scribe region 1B, like the embodiment. In other words, in the stage of finishing Step S2, it is more preferable that the bared portion of the main surface (top surface) of the semiconductor substrate SB without the insulating films (here, the insulating films IL1, IL2, and PA) included in the wiring structure is the whole scribe region 1B. In this case, in Step S4, the thickness (T2) of the semiconductor substrate SB can be measured at any position of the scribe region 1B, which makes easy the process of measuring the thickness (T2) of the semiconductor substrate SB in Step S4. Specifically, when the insulating films (here, the insulating films IL1, IL2, and PA) included in the wiring structure are eliminated to bare the main surface (top surface) of the semiconductor substrate SB in the whole scribe region 1B, the thickness (T2) of the semiconductor substrate SB can be measured at any position in the scribe region 1B in Step S4, which makes easy the process of measuring the thickness (T2) of the semiconductor substrate SB in Step S4. According to this, the manufacturing process of the semiconductor device can be performed easily. Further, in Step S4, the thickness (T2) of the semiconductor substrate SB can be measured at a plurality of arbitrary positions in the scribe region 1B, which makes it possible to measure the thickness (T2) of the semiconductor substrate SB more accurately.

Further, in the embodiment, it is preferable that in Step S4, a non-contact measuring method is used to measure the thickness (T2) of the semiconductor substrate SB. Here, the non-contact measuring method means a method of measuring the thickness (T2) of the semiconductor substrate SB without contact of a measurement instrument or device to the main surface (top surface) of the semiconductor substrate SB. When the non-contact measuring method is used in Step S4, the measurement instrument or device does not make contact with the main surface (top surface) of the semiconductor substrate SB and the wiring (M1) and insulating films (here, the insulating films IL1, IL2, and PA) forming the wiring structure formed on the main surface (top surface) of the semiconductor substrate SB. In Step S4, even when the non-contact measuring method is used, the back surface of the semiconductor substrate SB can be in contact with some instrument or base in order to hold (support) the semiconductor substrate SB.

When the thickness (T2) of the semiconductor substrate SB is measured by using the non-contact measuring method in Step S4, the measurement instrument or device is free from contact with the main surface (top surface) of the semiconductor substrate SB and the wiring (M1) and the insulating films (here, the insulating films IL1, IL2, and PA) forming the wiring structure formed on the main surface (top surface) of the semiconductor substrate SB; therefore, the reliability of the manufactured semiconductor device can be further improved.

Figure 23:
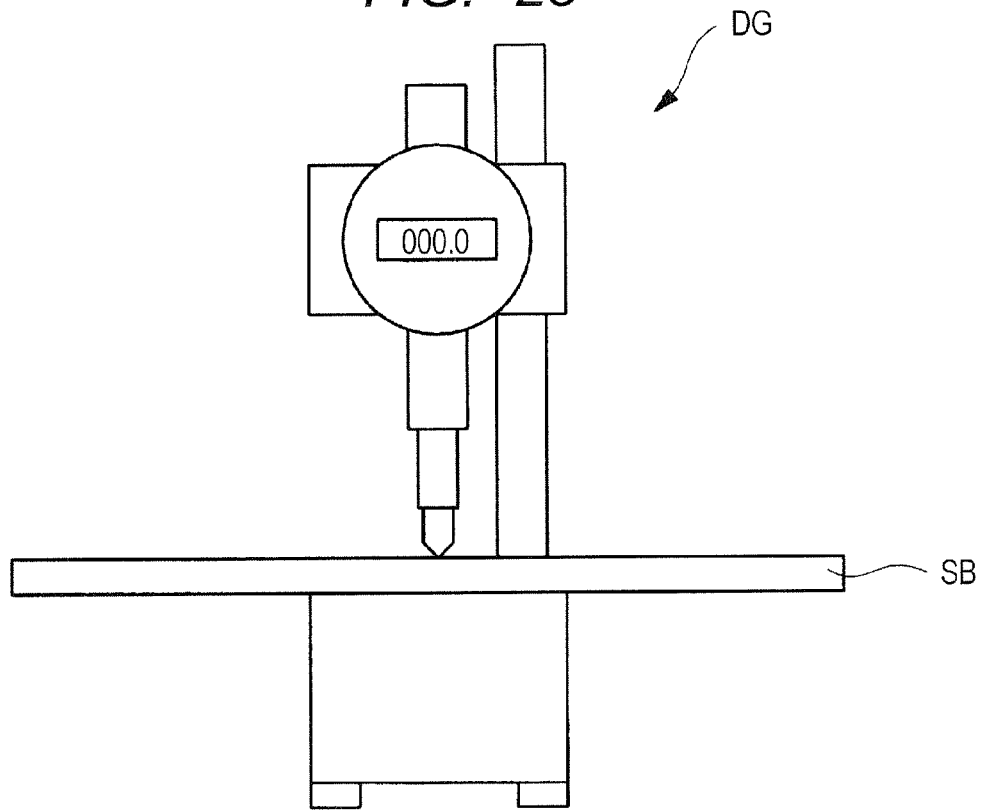
FIG. 23 is a view for use in describing an example of the method of measuring the thickness of a semiconductor substrate.

The method of measuring the thickness (T2) of the semiconductor substrate SB will be described with reference to FIGS. 23, 24, and 18. FIG. 23 is a view for use in describing an example of the above method, and FIG. 24 is a view for use in describing another example of the above method.

In the case of FIG. 23, a dial gage DG is used to measure the thickness of the semiconductor substrate SB. The measurement with the dial gage DG is a contact typed measuring method, and a probe of the dial gage DG has to be in contact with the top surface of the semiconductor substrate SB. When the contact typed measuring method is used, some measurement instrument (for example, the probe of the dial gage DG) has to be in contact with the main surface (top surface) of the semiconductor substrate SB, and the above contact may hurt the main surface of the semiconductor substrate SB. When the contact typed measuring method is used, some measurement instrument (for example, the probe of the dial gage DG) has to be in contact with the main surface (top surface) of the semiconductor substrate SB and a measurement portion has to be obtained in a quite large area on the main surface of the semiconductor substrate SB. In other words, on the main surface of the semiconductor substrate SB, it is necessary to secure the bared portion of the main surface of the semiconductor substrate SB without the insulating films (here, the insulating films IL1, IL2, and PA) included in the wiring structure for a comparatively large plane dimension (flat area). This means a decrease in the possible number of the semiconductor devices CP obtained from one sheet of the semiconductor substrate (semiconductor wafer), which causes an increase in the manufacturing cost of the semiconductor device CP.

Figure 24:
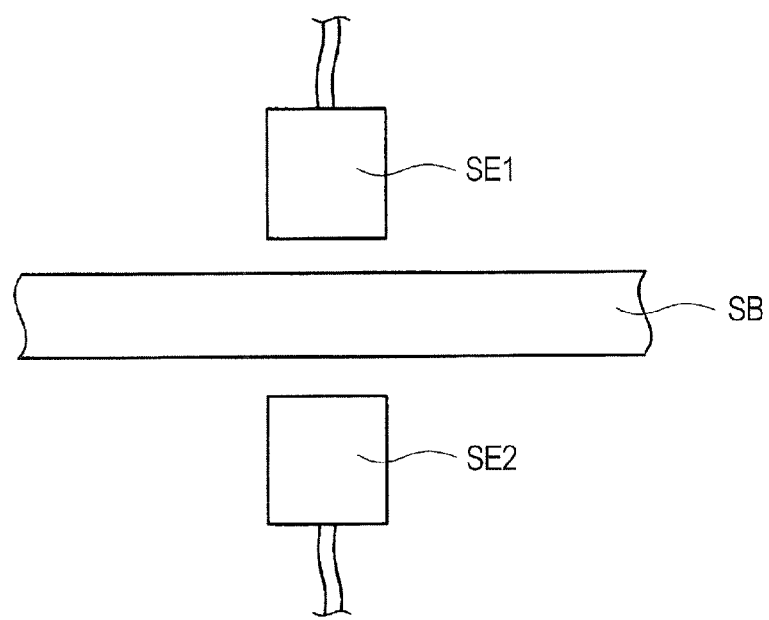
FIG. 24 is a view for use in describing the other example of the method of measuring the thickness of the semiconductor substrate.

FIG. 24 shows the case of using a capacitance typed measuring method and the capacitance typed measuring method is a type of the non-contact measuring method. Specifically, as shown in FIG. 24, with the semiconductor substrate SB interposed between a pair of sensors (electrodes) SE1 and SE2, the thickness of the semiconductor substrate SB interposed between the sensors SE1 and SE2 is measured based on the capacitance values detected by the sensors SE1 and SE2. In this case, the sensors SE1 and SE2 do not have to be in contact with the semiconductor substrate SB. In the case of FIG. 24, the sensor SE1 faces the main surface (top surface) of the semiconductor substrate SB and the sensor SE2 faces the back surface thereof. The capacitance values when the semiconductor substrate SB is arranged between the sensors SE1 and SE2 become a value depending on the dielectric constant and the thickness of the semiconductor substrate SB; therefore, the thickness of the semiconductor substrate SB can be measured based on the capacitance values detected by the sensors SE1 and SE2.

The case of FIG. 24 (capacitance typed measuring method) is the non-contact measuring method; therefore, the measurement instrument (for example, the sensor SE1) can be avoided from contact with the main surface (top surface) of the semiconductor substrate SB as well as the wiring (M1) and the insulating films (here, the insulating films IL1, IL2, and PA) forming the wiring structure formed on the main surface (top surface) of the semiconductor substrate SB, hence to further improve the reliability of the manufactured semiconductor device.

In the case of FIG. 24 (capacitance typed measuring method), however, since the semiconductor substrate SB has to be interposed between the sensor SE1 and the sensor SE2, a comparatively large area for measurement has to be secured on the main surface of the semiconductor substrate SB. In short, it is necessary to secure a comparatively large plane dimension (flat area) of the bared portion of the main surface of the semiconductor substrate SB where the insulating films (here, the insulating films IL1, IL2, and PA) included in the wiring structure are not formed. This leads to a reduction in the possible number of the semiconductor devices CP obtained from one sheet of the semiconductor substrate (semiconductor wafer), thereby increasing the manufacturing cost of the semiconductor device CP.

Therefore, in Step S4, like the embodiment, it is more preferable that the laser interferometry is used to measure the thickness (T2) of the semiconductor substrate SB (refer to the above FIG. 17).

Since the laser interferometry is the non-contact measuring method, when using the laser interferometry in Step S4, any measurement instrument does not have to be in contact with the main surface (top surface) of the semiconductor substrate SB as well as the wiring (M1) and the insulating films (here, the insulating films IL1, IL2, and PA) forming the wiring structure formed on the main surface (top surface) of the semiconductor substrate SB, which can improve the reliability of the manufactured semiconductor device further.

When using the laser interferometry in Step S4, the bared portion of the main surface of the semiconductor substrate SB without forming the insulating films (here, the insulating films IL1, IL2, and PA) included in the wiring structure, is irradiated with a laser light LZ1 and the light-emitting port (irradiation port) of the laser light LZ1 can be at a distance from the semiconductor substrate SB. Further, a detector for detecting a reflection wave LZ2 obtained by reflecting the laser light LZ1 on the main surface (top surface) of the semiconductor substrate SB and a reflection wave LZ3 obtained by reflecting the above on the back surface thereof (alternatively, a detector for detecting an interference wave of the reflection wave LZ2 and the reflection wave LZ3) can be at a distance from the semiconductor substrate SB. In the case of using the laser interferometry in Step S4, the thickness (T2) of the semiconductor substrate SB can be measured even in a smaller plane dimension (flat area). According to the laser interferometry, without increasing the plane dimension (flat area) of the bared portion of the main surface of the semiconductor substrate SB where the insulating films (here, the insulating films IL1, IL2, and PA) included in the wiring structure are not formed, the thickness (T2) of the semiconductor substrate SB can be measured. In other words, the plane dimension (flat area) of the bared portion of the main surface of the semiconductor substrate SB where the insulating films (here, the insulating films IL1, IL2, and PA) included in the wiring structure are not formed, can be reduced to some degree. Therefore, the possible number of the semiconductor devices CP obtained from one sheet of the semiconductor substrate (semiconductor wafer) can be increased, hence to reduce the manufacturing cost of the semiconductor device CP.

As mentioned above, in Step S4, the thickness (T2) of the semiconductor substrate SB is measured preferably in the scribe region 1B. In the measurement of the thickness (T2) of the semiconductor substrate SB using the laser interferometry in Step S4, it is preferable that the leaser is irradiated on the main surface (top surface) of the semiconductor substrate SB, in the scribe region 1B where the main surface (top surface) of the semiconductor substrate SB is bared without forming the insulating films (here, the insulating films IL1, IL2, and PA) included in the wiring structure. When using the laser interferometry in Step S4, the width of the scribe region 1B (width in a direction substantially vertical to the extending direction of the scribe region 1B) does not have to be increased just because Step S4 is performed in the scribe region 1B; therefore, the possible number of the semiconductor devices CP obtained from one sheet of the semiconductor substrate (semiconductor wafer) can be increased, hence to reduce the manufacturing cost of the semiconductor device CP.

This embodiment is effectively applied when the semiconductor element formed on the semiconductor substrate SB in the semiconductor device region 1A is a vertical power transistor. As the vertical power transistor formed in the semiconductor substrate SB, for example, a trench gate MISFET or IGBT (trench gate IGBT) can be preferably used. When the semiconductor element formed in the semiconductor substrate SB is the vertical power transistor, a comparatively large current flows between the first terminal (the pad for source PDS) on the top surface of the semiconductor substrate SB and the second terminal (the back electrode BE) on the back surface thereof through the vertical power transistor; therefore, the fluctuation in the thickness of the semiconductor substrate SB has a large effect on the electric properties. When the semiconductor element formed on the semiconductor substrate SB is the vertical power transistor, the thickness of the semiconductor substrate SB in the manufactured semiconductor device CP can be accurately controlled according to the embodiment; therefore, it is possible to avoid the fluctuation in the electric properties of the semiconductor device CP with the vertical power transistor formed and stabilize the device, hence to improve the reliability of the semiconductor device CP.

<About Comparison Example>

Figure 25:
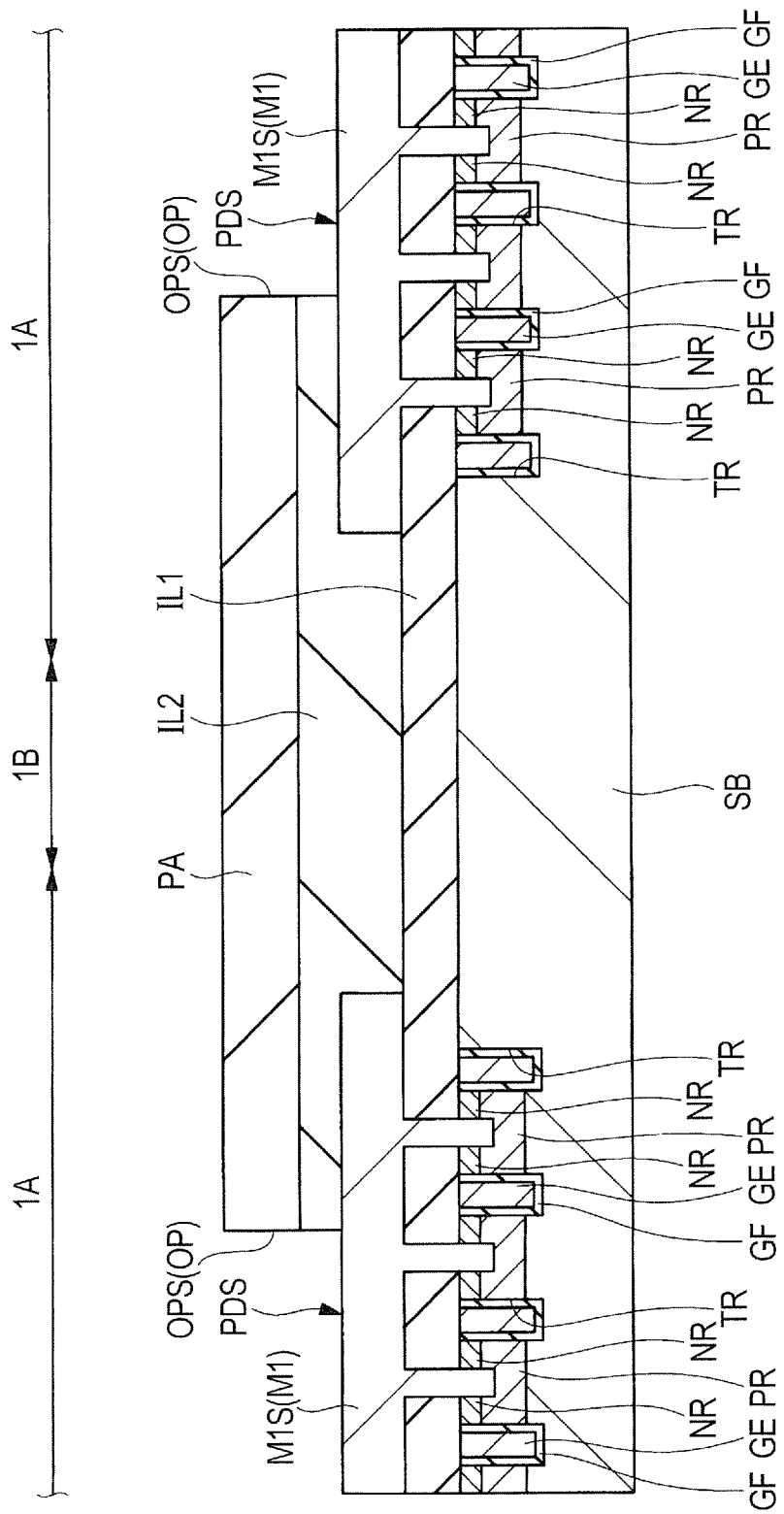
FIG. 25 is an important portion cross-sectional view in the manufacturing process of a semiconductor device in a first comparison example.
Figure 26:
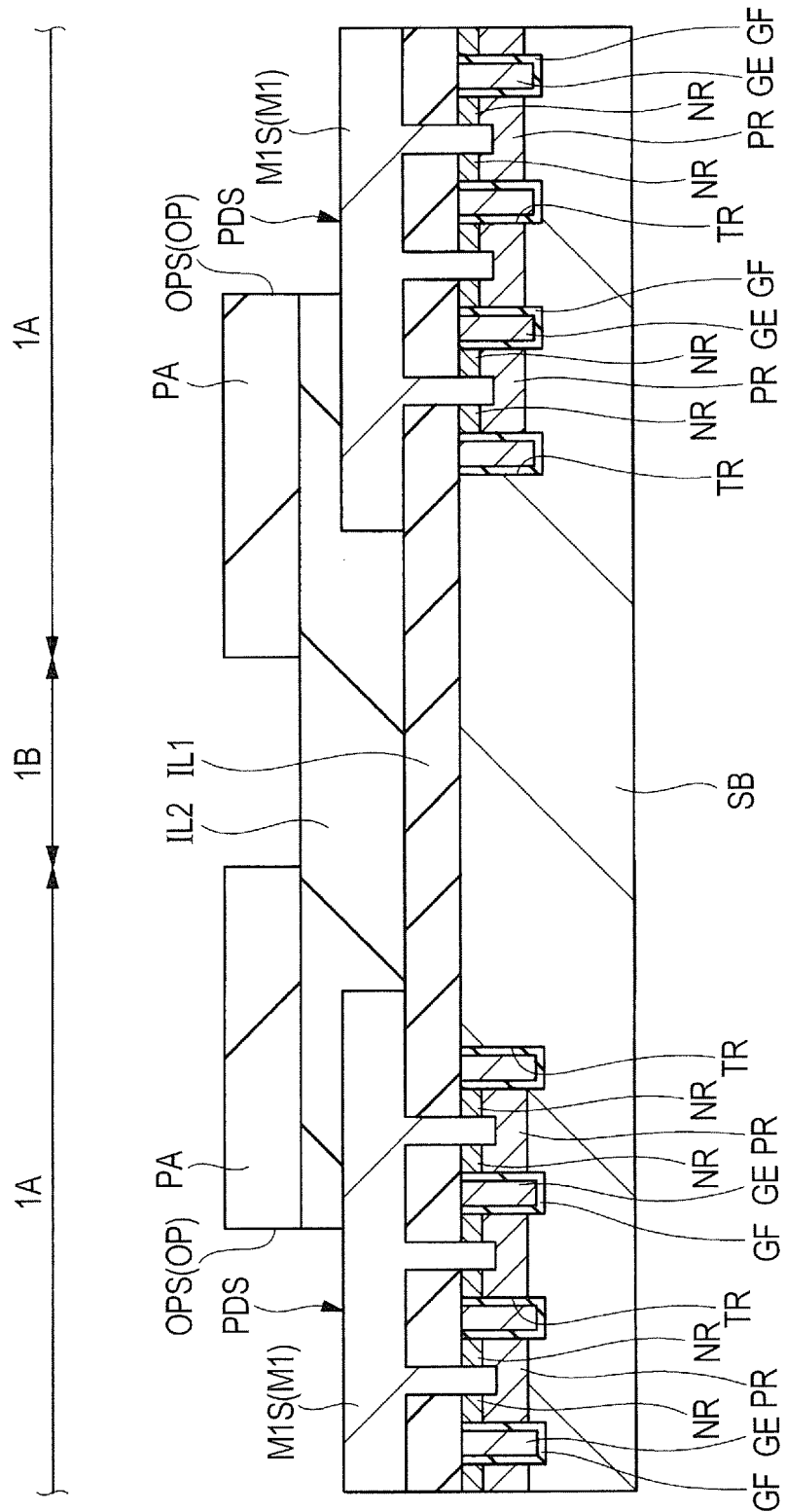
FIG. 26 is an important portion cross-sectional view in the manufacturing process of a semiconductor device in a second comparison example.
Figure 27:
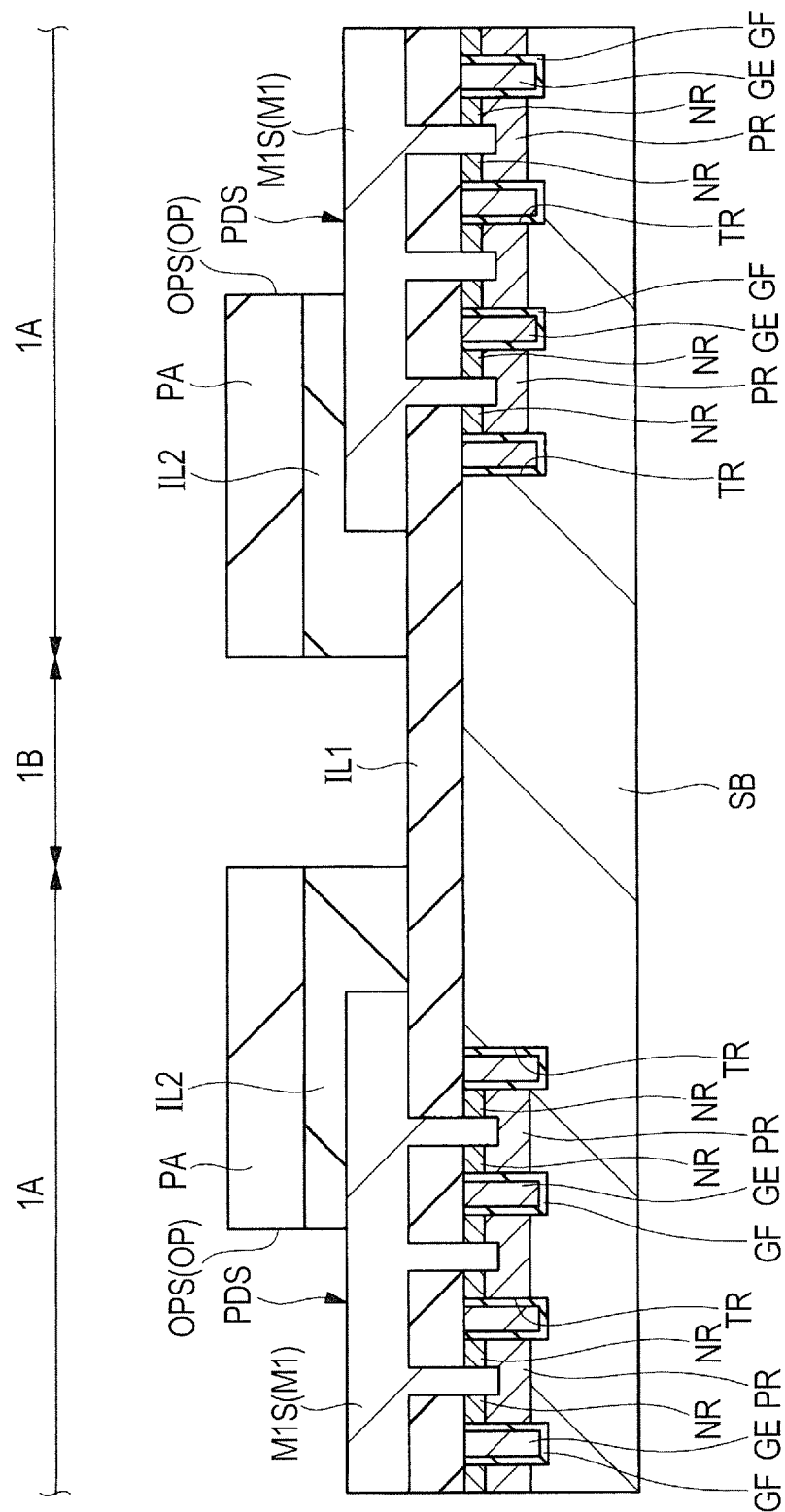
FIG. 27 is an important portion cross-sectional view in the manufacturing process of a semiconductor device in a third comparison example.

FIG. 25 is an important portion cross-sectional view in the manufacturing process of a semiconductor device according to a first comparison example, FIG. 26 is an important portion cross-sectional view in the manufacturing process of a semiconductor device according to a second comparison example, and FIG. 27 is an important portion cross-sectional view in the manufacturing process of a semiconductor device according to a third comparison example. FIGS. 25 to 27 correspond to FIG. 16, showing the state after performing the back polishing process.

The first consideration example shown in FIG. 25 is in the stage after finishing the process corresponding to Step S2, where the insulating films IL1, IL2, and PA are not eliminated but remain in the scribe region 1B. The second consideration example shown in FIG. 26 is in the stage after finishing the process corresponding to Step S2, where the insulating film PA is eliminated and the insulating films IL1 and IL2 remain in the scribe region 1B. The third consideration example shown in FIG. 27 is in the stage after finishing the process corresponding to Step S2, where the insulating films PA and IL2 are eliminated and the insulating film IL1 remains in the scribe region 1B.

Therefore, in the cases of the first to the third comparison examples in FIGS. 25 to 27, it is hard to measure the thickness of only the semiconductor substrate SB even if trying to measure the thickness of the semiconductor substrate SB after the back polishing process. In the case of the first consideration example shown in FIG. 25, the thickness of not only the semiconductor substrate SB but also the insulating films IL1, IL2, and PA is measured; in the case of the second consideration example shown in FIG. 26, the thickness of not only the semiconductor substrate SB but also the insulating films IL1 and IL2 is measured; and in the case of the third consideration example shown in FIG. 27, the thickness of not only the semiconductor substrate SB but also the insulating film IL1 is measured.

Therefore, in the cases of the first to the third comparison examples in FIGS. 25 to 27, the thickness of the semiconductor substrate SB is difficult to be controlled to a predetermined design value; this leads to the fluctuation in the electric properties of the semiconductor device having the back electrode, hence to reduce the reliability of the semiconductor device.

On the contrary, in the embodiment, as mentioned above, the thickness of the semiconductor substrate SB is measured in a region to measure the thickness of the semiconductor substrate SB (preferably, in the scribe region 1B), with the insulating films IL1, IL2, and PA included in the wiring structure not formed on the semiconductor substrate SB; accordingly, the thickness of only the semiconductor substrate SB can be measured without being effected by the insulating films IL1, IL2, and PA included in the wiring structure. In the embodiment, the thickness of the semiconductor substrate SB can be accurately measured and the thickness of the semiconductor substrate SB can be accurately controlled to a predetermined design value. As the result, in the semiconductor device having the back electrode, the fluctuation in the thickness of the semiconductor substrate SB can be restrained or inhibited, and accordingly, the fluctuation in the electric properties accompanying the fluctuation in the thickness of the semiconductor substrate SB can be restrained or inhibited. Therefore, the reliability of the semiconductor device can be improved.

<About Modified Example>

Next, a modified example of the embodiment will be described.

Figure 28:
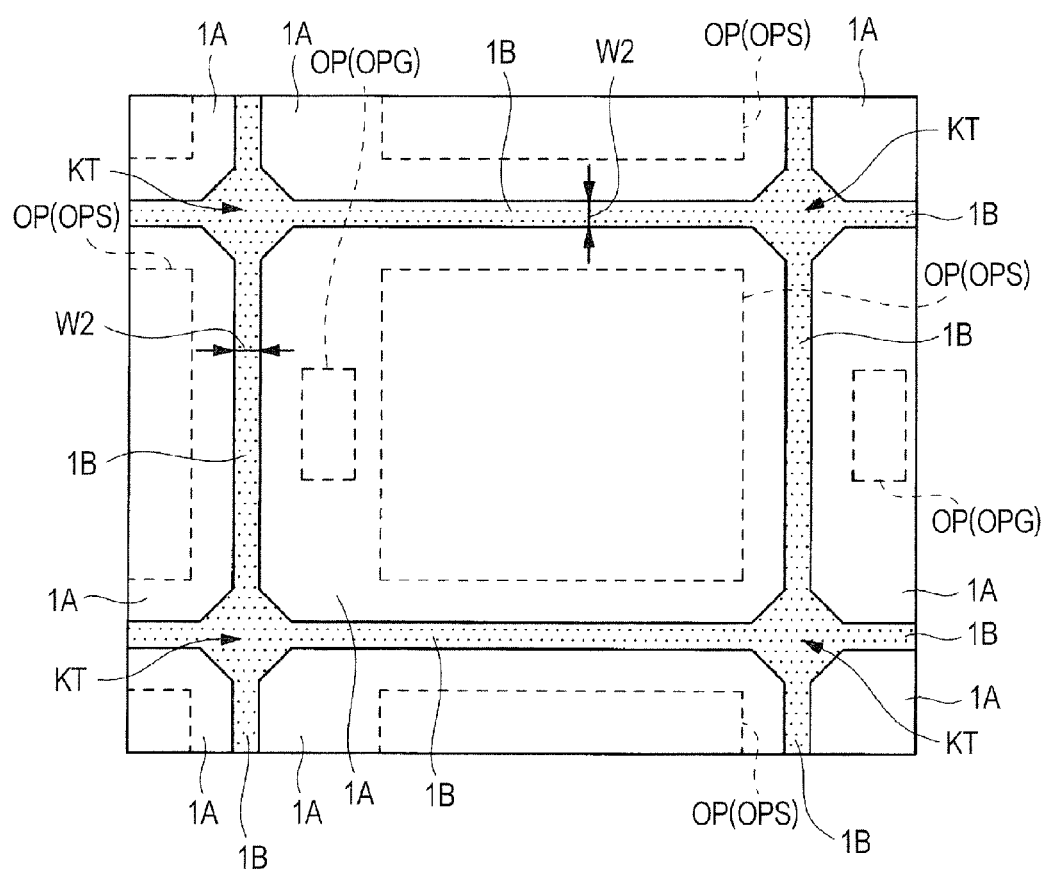
FIG. 28 is an important portion top plan view of a semiconductor device according to a first modified example.

FIG. 28 is an important portion top plan view of a semiconductor device CP according to a first modified example, corresponding to FIG. 22. Similarly to FIG. 22, FIG. 28 is also a top plan view but for the sake of easy understanding, the dotted hatching is attached to the bared top surface of the semiconductor substrate SB with the insulating films IL1, IL2, and PA eliminated.

In the case of FIG. 22, the width W1 of the bared portion of the main surface of the semiconductor substrate SB without the insulating films IL1, IL2, and PA (the dotted hatching portion) is almost identical (constant). The width W1 is a width (size) in parallel to the main surface of the semiconductor substrate SB and in a direction substantially vertical to the extending direction of the scribe region 1B.

On the other hand, in the case of FIG. 28 (the first modified example), the width W2 of the bared portion of the main surface of the semiconductor substrate SB (the dotted hatching portion) without the insulating films IL1, IL2, and PA is almost identical (constant) in the area other than each intersection KT in the scribe region 1B; however, in the intersections KT in the scribe region 1B, the width W2 becomes larger than in the area other than the above intersections KT. In short, the width W2 of the intersection KT is larger than the width W2 in the area other than the intersection KT in the scribe region 1B. Viewed from another angle, in the case of FIG. 28 (the first modified example), the bared portion (dotted hatching portion) of the main surface (top surface) of the semiconductor substrate SB without the insulating films IL1, IL2, and PA is locally expanded in the intersections KT in the scribe region 1B. In the case of FIG. 28 (the first modified example), in Step S4, the thickness (T2) of the semiconductor substrate SB is measured in the intersection KT in the scribe region 1B.

The width W2 is a width (size) in parallel to the main surface of the semiconductor substrate SB and in a direction substantially vertical to the extending direction of the scribe region 1B. The intersection KT in the scribe region 1B is an intersection in the scribe region 1B in plan view and in FIG. 28, it corresponds to the intersection (cross point) of the scribe region 1B portion extending in the horizontal direction and the scribe region 1B portion extending in the vertical direction in FIG. 28. In other words, in plan view, the scribe region 1B includes a portion extending in the first direction (the horizontal direction in FIG. 28) and a portion extending in the second direction (the vertical direction in FIG. 28) orthogonal to the first direction, and the intersection (cross point) of the portion extending in the first direction and the portion extending in the second direction in the scribe regions 1B corresponds to the intersection KT.

In the case of FIG. 28 (the first modified example), the bared portion of the main surface (top surface) of the semiconductor substrate SB without forming the insulating films (here, the insulating films IL1, IL2, and PA) included in the wiring structure is expanded in the intersections KT in the scribe regions 1B in plan view, and in Step S4, the thickness (T2) of the semiconductor substrate SB is measured in the intersection KT in the scribe region 1B. According to this, since the width W2 in the area other than the intersections is not large, the possible number of the semiconductor devices CP obtained from one sheet of the semiconductor substrate (semiconductor wafer) can be increased, hence to reduce the manufacturing cost of the semiconductor device CP. In the intersections KT in the scribe region 1B, the bared portion of the main surface (top surface) of the semiconductor substrate SB without forming the insulating films (here, the insulating films IL1, IL2, and PA) included in the wiring structure is expanded, where the thickness (T2) of the semiconductor substrate SB is measured, thereby making it easy to measure the thickness (T2) of the semiconductor substrate SB in Step S4. As the result, the case of FIG. 28 (the first modified example) can achieve the following two effects; the possible number of the semiconductor devices CP obtained from one sheet of the semiconductor substrate (semiconductor wafer) can be increased and at the same time, the plane dimension of the thickness (T2) measurable region in Step S4 can be enlarged, to make the measurement easy.

For example, when the width of the scribe region 1B is short on accurately irradiating the main surface of the semiconductor substrate SB with the laser light LZ1, when the width (W1) of the bared main surface portion of the semiconductor substrate SB without forming the insulating films IL1, IL2, and PA is increased in the whole scribe region 1B, the possible number of the semiconductor devices CP obtained from one sheet of the semiconductor substrate is decreased. On the contrary, as shown in FIG. 28, the bared main surface portion of the semiconductor substrate SB without forming the insulating films IL1, IL2, and PA is locally expanded in the intersections KT in the scribe region 1B and when the laser light LZ1 is irradiated there, the laser light LZ1 can be accurately irradiated on the main surface of the semiconductor substrate SB and the possible number of the semiconductor devices CP obtained from one sheet of the semiconductor substrate can be avoided from decreasing.

In the semiconductor substrate SB, there exist a plurality of intersections KT in the scribe region 1B; however, at least in one intersection KT of them, the bared main surface portion of the semiconductor substrate SB without forming the insulating films (here, the insulating films IL1, IL2, and PA) included in the wiring structure may be expanded. In the case of FIG. 28, although the bared main surface portion of the semiconductor substrate SB without forming the insulating films IL1, IL2, and PA is locally expanded in a plurality of the intersections KT in the scribe region 1B in the semiconductor substrate SB, the bared main surface portion of the semiconductor substrate SB without forming the insulating films IL1, IL2, and PA can be locally expanded only in one intersection of them in the scribe region 1B. In either way, the thickness (T2) of the semiconductor substrate SB may be measured in Step 4 in the intersection KT where the bared main surface portion of the semiconductor substrate SB without forming the insulating films IL1, IL2, and PA is locally expanded. When the bared main surface portion of the semiconductor substrate SB without forming the insulating films IL1, IL2, and PA is locally expanded in only one of the plural intersections Kt in the scribe region 1B, the possible number of the semiconductor device regions 1A affected by the expansion of the bared region of the semiconductor substrate SB can be reduced advantageously.

Next, a second modified example and a third modified example will be described with reference to FIGS. 29 and 30.

Figure 29:
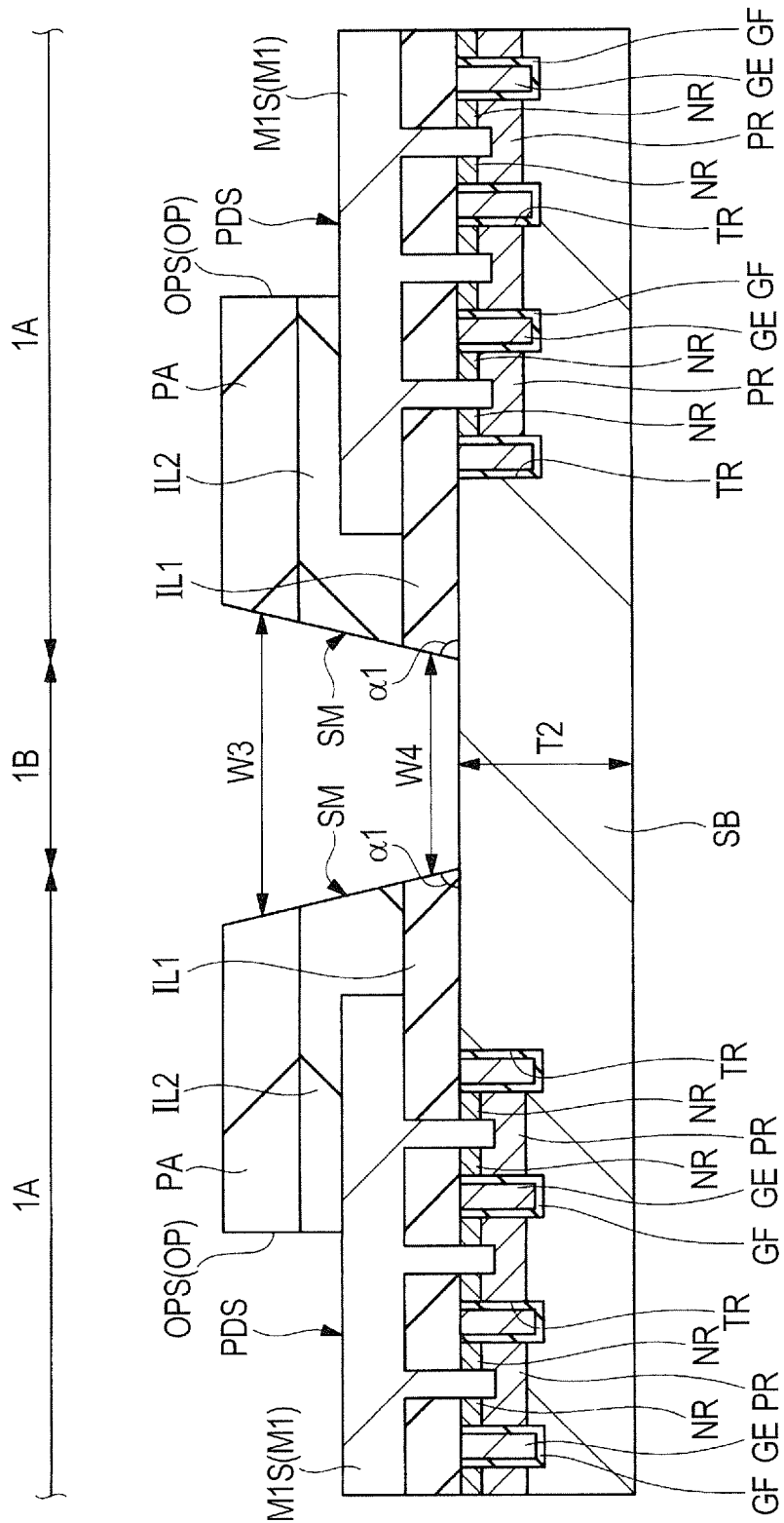
FIG. 29 is an important portion cross-sectional view in the manufacturing process of a semiconductor device according to a second modified example.
Figure 30:
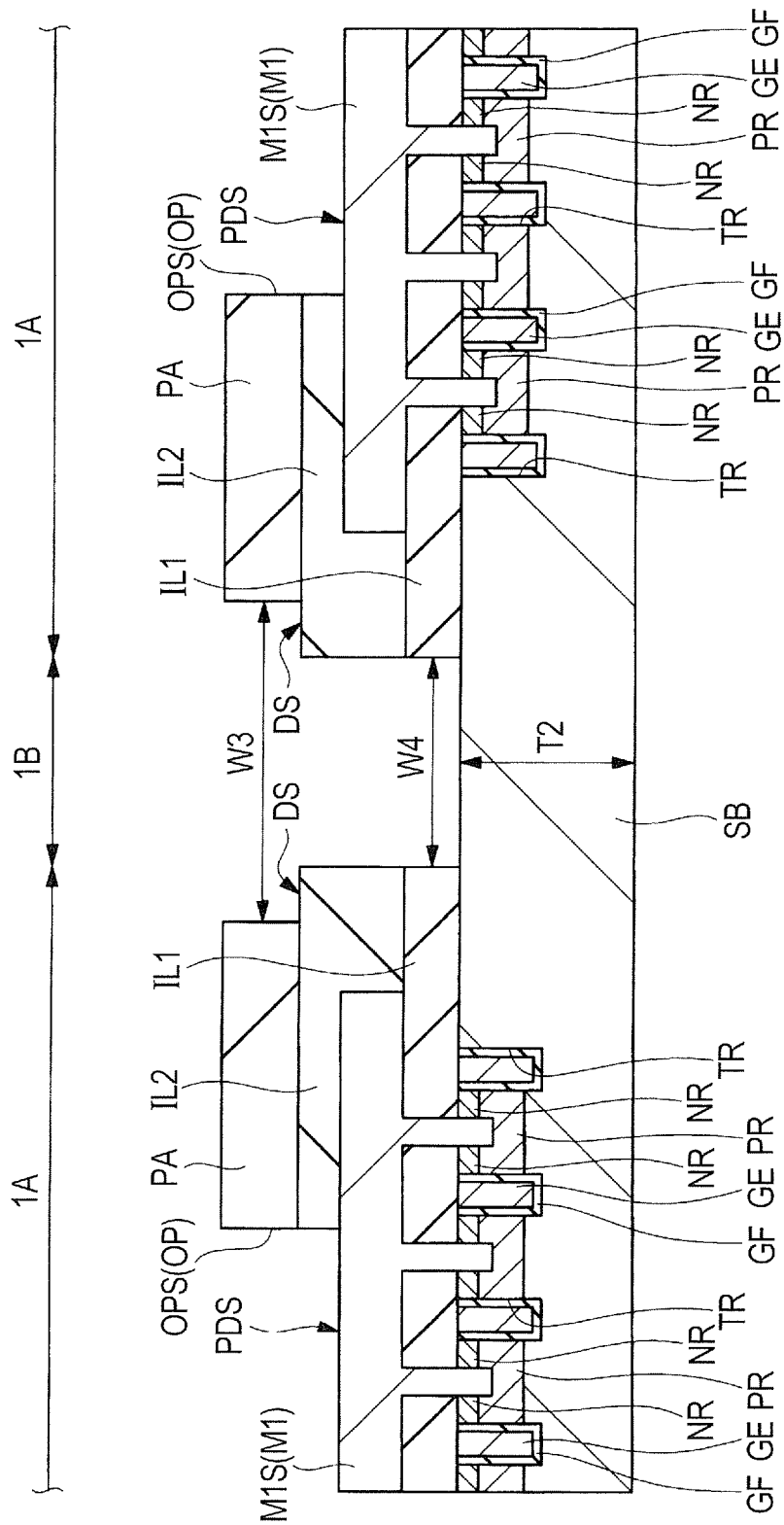
FIG. 30 is an important portion cross-sectional view in the manufacturing process of a semiconductor device according to a third modified example.

FIG. 29 is an important portion cross-sectional view of the manufacturing process of a semiconductor device CP according to a second modified example, FIG. 30 is an important portion cross-sectional view of the manufacturing process of a semiconductor device CP according to a third modified example, and the both corresponds to the above FIG. 16. Similarly to FIG. 16, FIGS. 29 and 30 show the state after performing the back polishing process in Step S3.

Also in the cases of FIG. 16, FIG. 29 (second modified example), and FIG. 30 (third modified example), the scribe region 1B is formed in a groove shape in the process of measuring the thickness (T2) of the semiconductor substrate SB in Step S4. This is because in the semiconductor device region 1A, the insulating films (here, the insulating films IL1, IL2, and PA) included in the wiring structure formed on the semiconductor substrate SB are eliminated in the scribe region 1B. The groove shaped state of the scribe region 1B is kept from the stage of finishing Step S2 to the stage before performing the dicing process in Step S6. Also in the cases of FIG. 16, FIG. 29 (second modified example), and FIG. 30 (third modified example), the scribe region 1B is formed in a groove shape in the stage of finishing Step S2 and the state is kept to the stage before performing the dicing process in Step S6.

In the case of FIG. 16, the groove shape of the scribe region 1B has the substantially same width in the width W3 (first width) in the top and in the width W4 (second width) in the bottom (that is, W3=W4), and in the cases of FIG. 29 (second modified example) and FIG. 30 (third modified example), the width W3 (first width) in the upper portion is larger than the width W4 (second width) in the lower portion (that is, W3>W4) in the groove shaped scribe region 1B.

Here, the width W3 is a width (dimension) in parallel to the main surface of the semiconductor substrate SB and in a direction substantially vertical to the extending direction of the scribe region 1B. Similarly, the width W4 is a width (dimension) in parallel to the main surface of the semiconductor substrate SB and in a direction substantially vertical to the extending direction of the scribe region 1B.

In the case of FIG. 29 (second modified example), the lateral surface SM of the groove shaped scribe region 1B has a taper. Specifically, in the case FIG. 29, the lateral surface SM of the groove shaped scribe region 1B is inclined at a predetermined angle from a direction vertical to the main surface of the semiconductor substrate SB, and the angle α1 made by the lateral surface SM and the main surface of the semiconductor substrate SB is less than 90° (that is, α1<90°). The lateral surface SM of the groove shaped scribe region 1B corresponds to the lateral surface (end surface) of the insulating films IL1, IL2, and PA in the scribe region 1B. In the case of FIG. 29, the lateral surface SM of the groove shaped scribe region 1B has a taper and the width of the groove shaped scribe region 1B gradually decreases according to the lower portion of the groove shape.

On the other hand, in the case of FIG. 30 (third modified example), the lateral surface of the groove shaped scribe region 1B has a step DS. Therefore, in the case of FIG. 30, the width of the groove shape at the upper position than the step DS is larger than the width of the groove shape at the lower position than the step DS, in the scribe region 1B.

According to this, both the cases of FIG. 29 (second modified example) and FIG. 30 (third modified example) realize the structure having the width W3 in the upper portion larger than the width W4 in the lower portion of the groove shaped scribe region 1B.

When the width W3 in the upper portion is larger than the width W4 in the lower portion (that is, W3>W4) in the groove shaped scribe region 1B, it can obtain such an advantage that the thickness (T2) of the semiconductor substrate SB can be easily measured by using the laser interferometry in Step S4. This will be specifically described.

Specifically, when performing Step S4, the scribe region 1B is formed in a groove shape, and in the case of using the laser interferometry in Step S4, the main surface (top surface) of the semiconductor substrate SB forming the bottom surface of the groove shaped scribe region 1B is irradiated with the laser light LZ1. When the width W3 in the upper portion is larger than the width W4 in the lower portion (W3>W4) in the groove shaped scribe region 1B, the tolerance of the angle of the laser light LZ1 incident to the main surface of the semiconductor substrate SB can be increased. In other words, when the width W3 is larger than the width W4 (W3>W4), the laser light LZ1 can be irradiated to the semiconductor substrate SB without being interrupted by the insulating films (here, the insulating films IL1, IL2, and PA) included in the wiring structure, even when the direction of the laser light LZ1 incident to the main surface of the semiconductor substrate SB is inclined from the normal line direction of the main surface of the semiconductor substrate SB to some degree. This makes it easy to measure the thickness (T2) of the semiconductor substrate SB using the laser interferometry in Step S4.

When the width W4 in the lower portion of the groove shaped scribe region 1B is made too large, a distance from the semiconductor element formed in the semiconductor substrate SB to the end portion of the insulating film IL1 (end portion forming the lateral surface of the groove shaped scribe region 1B) becomes smaller; however, this is not preferable on the reliability of the semiconductor device. When the distance from the semiconductor element formed on the semiconductor substrate SB to the end portion of the insulating film IL1 is intended to be larger, the plane dimension (flat area) in the semiconductor element formable area in the semiconductor device region 1A is reduced. On the contrary, when the width W3 is larger than the width W4 (W3>W4), the width W4 in the lower portion of the groove shaped scribe region 1B can be reduced while increasing the width W3 in the upper portion thereof. By increasing the width W3 in the upper portion of the groove shaped scribe region 1B, as mentioned above, the tolerance of the angle of the laser light LZ1 incident to the main surface of the semiconductor substrate SB can be increased, thereby making it easy to measure the thickness (T2) of the semiconductor substrate SB according to the laser interferometry in Step S4. By reducing the width W4 in the lower portion of the groove shaped scribe region 1B, a distance from the semiconductor element formed on the semiconductor substrate SB to the end portion of the insulating film IL1 can be secured easily, thereby improving the reliability of the semiconductor device and increasing the plane dimension (flat area) in the semiconductor element formable area in the semiconductor device region 1A. Therefore, it is effective at downsizing of the semiconductor device.

In order to realize the structure having the width W3 larger than the width W4 (W3>W4), the case of FIG. 29 (second modified example) has a taper in the lateral surface SM of the groove shaped scribe region 1B. This structure can be realized by, for example, applying the taper etching to the etching of the insulating films PA, IL2, and IL1 in the scribe region 1B.

In FIG. 29, all the lateral surfaces (end surfaces) of the insulating films IL1, IL2, and PA in the scribe region 1B have taper; as another form, in the scribe region 1B, the lateral surface or surfaces (end surface or surfaces) of one or two layers of the insulating films IL1, IL2, and PA may have taper. In this case, in the scribe region 1B, the lateral surface without taper, of the lateral surfaces of the insulating films IL1, IL2, and PA, is substantially vertical to the main surface of the semiconductor substrate SB. In the scribe region 1B, also when the lateral surface or surfaces (end surface or surfaces) of one or two layers of the insulating films IL1, IL2, and PA have taper, the tolerance of the angle of the laser light LZ1 incident to the main surface of the semiconductor substrate SB can be increased, thereby making it easy to measure the thickness (T2) of the semiconductor substrate SB according to the laser interferometry. The tolerance of the angle of the laser light LZ1 incident to the main surface of the semiconductor substrate SB is advantageously increased more when the lateral surfaces of all the layers of the insulating films IL1, IL2, and PA in the scribe region 1B have taper like FIG. 29 than when the lateral surface or surfaces of one or two layers of the insulating films IL1, IL2, and PA have taper in the scribe region 1B.

Further, in order to realize the structure having the width W3 larger than the width W4 (W3>W4), in the case of FIG. 30 (third modified example), the lateral surface of the groove shaped scribe region 1B has the step DS. In the case of FIG. 30, in the scribe region 1B, the lateral surface (end surface) of the insulating film PA is back away from the lateral surface (end surface) of the insulating film IL2 (in the direction far away from the scribe region 1B), and the lateral surface of the insulating film PA is deviated from the lateral surface of the insulating film IL2, hence to form the step DS. In the case of FIG. 30, in the scribe region 1B, the lateral surface (end surface) of the insulating film IL2 is aligned with the lateral surface (end surface) of the insulating film IL1. By the lateral surfaces (end surfaces) of the insulating films IL1, IL2, and PA, the lateral surface of the groove shaped scribe region 1B is formed.

Another form of FIG. 30 (third modified example), in the scribe region 1B, the lateral surface of the insulating film PA is aligned with the lateral surface of the insulating film IL2; simultaneously, the lateral surface of the insulating film IL2 is back away from the lateral surface of the insulating film IL1 (in the direction far away from the scribe region 1B), and the lateral surface of the insulating film IL2 is deviated from the lateral surface of the insulating film IL1, hence to form a step. As another form of FIG. 30 (third modified example), in the scribe region 1B, the lateral surface of the insulating film PA is back away from the lateral surface of the insulating film IL2 and the lateral surface of the insulating film IL2 is back away from the lateral surface of the insulating film IL1, hence to form two steps. Accordingly, the lateral surface of the groove shaped scribe region 1B may have not only one step (DS) but also a plurality of steps (DS).

The structure of FIG. 30 can be formed by, for example, at first obtaining the structure of FIG. 13, forming a photoresist pattern (not illustrated) on the semiconductor substrate SB, and then etching the insulating films IL2 and IL1 using the photoresist pattern as the etching mask. Here, in the scribe region 1B, such a plane shape of the photoresist pattern is set that the insulating films IL2 and IL1 may be etched with a width narrower than the width of the insulating film PA to be etched.

As set forth hereinabove, the invention made by the inventor et al. has been described specifically based on the embodiments; the invention is not restricted to the above embodiment but it is needless to say that various modifications are possible without departing from the spirit.

What is claimed is:

1. A method of manufacturing a semiconductor device comprising:
    (a) preparing a semiconductor substrate including a semiconductor device region surrounded by a scribe region in plan view;
    (b) forming a semiconductor element in the semiconductor device region and forming a wiring structure over a main surface of the semiconductor substrate in the semiconductor device region;
    (c) after (b), polishing a back surface opposite to the main surface of the semiconductor substrate to thin the semiconductor substrate;
    (d) after (c), measuring a thickness of the semiconductor substrate;
    (e) after (d), forming a back electrode on the back surface of the semiconductor substrate; and
    (f) cutting the semiconductor substrate along the scribe region,
    wherein the wiring structure formed in (b) includes one or more layers of insulating films, and
    wherein in (d), the thickness of the semiconductor substrate is measured only in one or more first regions where the main surface of the semiconductor substrate is exposed and the one or more layers of the insulating films are not formed.

2. The method according to claim 1,
    wherein the one or more first regions are within the scribe region.

3. The method according to claim 1,
    wherein in a stage of finishing (b), the one or more layers of the insulating films included in the wiring structure is not formed on the main surface of the semiconductor substrate in the scribe region, and
    wherein in (d), the thickness of the semiconductor substrate is measured in the scribe region.

4. The method according to claim 3,
    wherein in a stage of finishing (b), the scribe region above the main surface of the semiconductor substrate has a groove shape formed by facing walls of the one or more layers of the insulating films.

5. The method according to claim 1,
    wherein in (d), a non-contact measuring method is used to measure the thickness of the semiconductor substrate.

6. The method according to claim 1,
    wherein in (d), laser interferometry is used to measure the thickness of the semiconductor substrate.

7. The method according to claim 6,
wherein in (d), the main surface of the semiconductor substrate in the scribe region is irradiated with a laser to measure the thickness of the semiconductor substrate, the main surface of the semiconductor substrate in the scribe region being exposed without forming the one or more layers of the insulating films.

8. The method according to claim 6,
wherein in a stage of finishing (b), the scribe region above the main surface of the semiconductor substrate has a groove shape formed by sidewalls of the one or more layers of the insulating films, and
wherein a first width in an upper portion of the groove shape is larger than a second width in a lower portion of the groove shape.

9. The method according to claim 8,
wherein a lateral surface of the groove shape has a taper.

10. The method according to claim 8,
wherein a lateral surface of the groove shape has a step.

11. The method according to claim 3,
wherein an exposed portion of the main surface of the semiconductor substrate without forming the one or more layers of the insulating films is locally expanded at a corner of the semiconductor device region, where the scribe region intersects with an adjacent scribe region in plan view, and
wherein in (d), the thickness of the semiconductor substrate is measured at the locally-expanded, exposed portion.

12. The method according to claim 1,
wherein the semiconductor element is a vertical power transistor.

13. The method according to claim 1, wherein the main surface of the substrate in one or more first regions where the thickness is measured is substantially coplanar with the main surface of the substrate in the semiconductor device region.

14. A method of manufacturing a semiconductor device comprising:
(a) preparing a semiconductor substrate including a semiconductor device region surrounded by a scribe region in plan view;
(b) forming a semiconductor element in the semiconductor device region and forming a wiring structure over a main surface of the semiconductor substrate in the semiconductor device region;
(c) after (b), polishing a back surface opposite to the main surface of the semiconductor substrate to thin the semiconductor substrate;
(d) after (c), measuring a thickness of the semiconductor substrate;
(e) after (d), forming a back electrode on the back surface of the semiconductor substrate; and
(f) cutting the semiconductor substrate along the scribe region,
wherein the wiring structure formed in (b) includes one or more layers of insulating films,
wherein in a stage of finishing (b), the one or more layers of the insulating films included in the wiring structure are not formed on the main surface of the semiconductor substrate in the scribe region, and
wherein in (d), the thickness of the semiconductor substrate is measured in the scribe region according to laser interferometry.

15. The method according to claim 14,
wherein in a stage of finishing (b), the scribe region above the main surface of the semiconductor substrate has a groove shape formed by sidewalls of the one or more layers of the insulating films, and
wherein a first width in an upper portion of the groove shape is larger than a second width in a lower portion of the groove shape.

16. The method according to claim 14, wherein in (d), only the scribe regions are illuminated with laser light in performing the laser interferometry.

17. The method according to claim 14, wherein the main surface of the substrate in the scribe region where laser interferometry is performed is substantially coplanar with the main surface of the substrate in the semiconductor device region.

* * * * *